United States Patent [19]

Usami et al.

[11] Patent Number: 5,283,480
[45] Date of Patent: Feb. 1, 1994

[54] SEMICONDUCTOR INTEGRATED CIRCUIT DEVICE WITH A PLURALITY OF LOGIC CIRCUITS HAVING ACTIVE PULL-DOWN FUNCTIONS

[75] Inventors: Mitsuo Usami; Noboru Shiozawa, both of Ohme; Toshio Yamada; Hiromasa Katoh, both of Hamura; Kazuyoshi Satoh, Tokorozawa; Tohru Kobayashi, Iruma; Tatsuya Kimura; Masato Hamamoto, both of Ohme; Atsushi Shimizu, Ohme; Kaoru Koyu, Ohme, all of Japan

[73] Assignee: Hitachi, Ltd., Tokyo, Japan

[21] Appl. No.: 557,109

[22] Filed: Jul. 25, 1990

Related U.S. Application Data

[63] Continuation-in-part of Ser. No. 330,461, Mar. 30, 1989, Pat. No. 4,999,520.

[30] Foreign Application Priority Data

| Apr. 2, 1988 | [JP] | Japan | 63-81645 |
| Apr. 12, 1988 | [JP] | Japan | 63-89622 |
| Oct. 28, 1988 | [JP] | Japan | 63-274170 |
| Jul. 25, 1989 | [JP] | Japan | 1-192005 |

[51] Int. Cl.⁵ .................................. H03K 19/013
[52] U.S. Cl. ....................... 307/456; 307/443; 307/296.6
[58] Field of Search ............... 307/454, 455, 456, 466, 307/467, 443, 542, 551, 559, 561, 566, 300, 280, 296.6

[56] References Cited

U.S. PATENT DOCUMENTS

| 4,486,674 | 12/1984 | Neely | 307/456 X |
| 4,605,870 | 8/1986 | Dansky et al. | 307/456 X |
| 4,698,525 | 10/1987 | Tavana et al. | 307/456 |
| 4,835,420 | 5/1989 | Rosky | 307/475 |
| 4,860,065 | 8/1989 | Koyama | 307/456 X |
| 4,926,065 | 5/1990 | Coy et al. | 307/475 |
| 4,999,520 | 3/1991 | Usami et al. | 307/456 |

Primary Examiner—David R. Hudspeth
Attorney, Agent, or Firm—Antonelli, Terry, Stout & Kraus

[57] ABSTRACT

In accordance with one aspect of the invention, a semiconductor integrated circuit is provided wherein an input circuit is formed by a phase split circuit having a bipolar transistor which outputs an inverted output from the collector and a non-inverted output from the emitter. The emitter follower output circuit is driven by an inverted output of the phase split circuit. Meanwhile, an emitter load of the emitter follower output circuit is formed by a transistor, and the emitter load transistor is temporarily driven conductively by a charging current of the capacitance to be charged by the rising edge of the non-inverted output of the phase split circuit. As a second aspect of the invention, a logic circuit is formed of a logic portion and an output portion. The output portion includes an emitter follower output transistor receiving an output signal generated by the logic portion and an active pull-down transistor receiving at its base a signal supplied thereto through a capacitance element. The signal received by the active pull-down transistor has a phase reverse to that of the input signal supplied to the base of said output transistor. Between the base and emitter of the active pull-down transistor, there is disposed a bias circuit formed of a transistor receiving at its base a predetermined bias voltage and an emitter resistor. Further, between a junction point of the emitter follower output transistor and the active pull-down transistor and the emitter of the transistor as a constituent of the bias circuit, there is disposed a capacitance element for feeding back the output signal.

17 Claims, 20 Drawing Sheets

LOG1

LOG1

LOG1

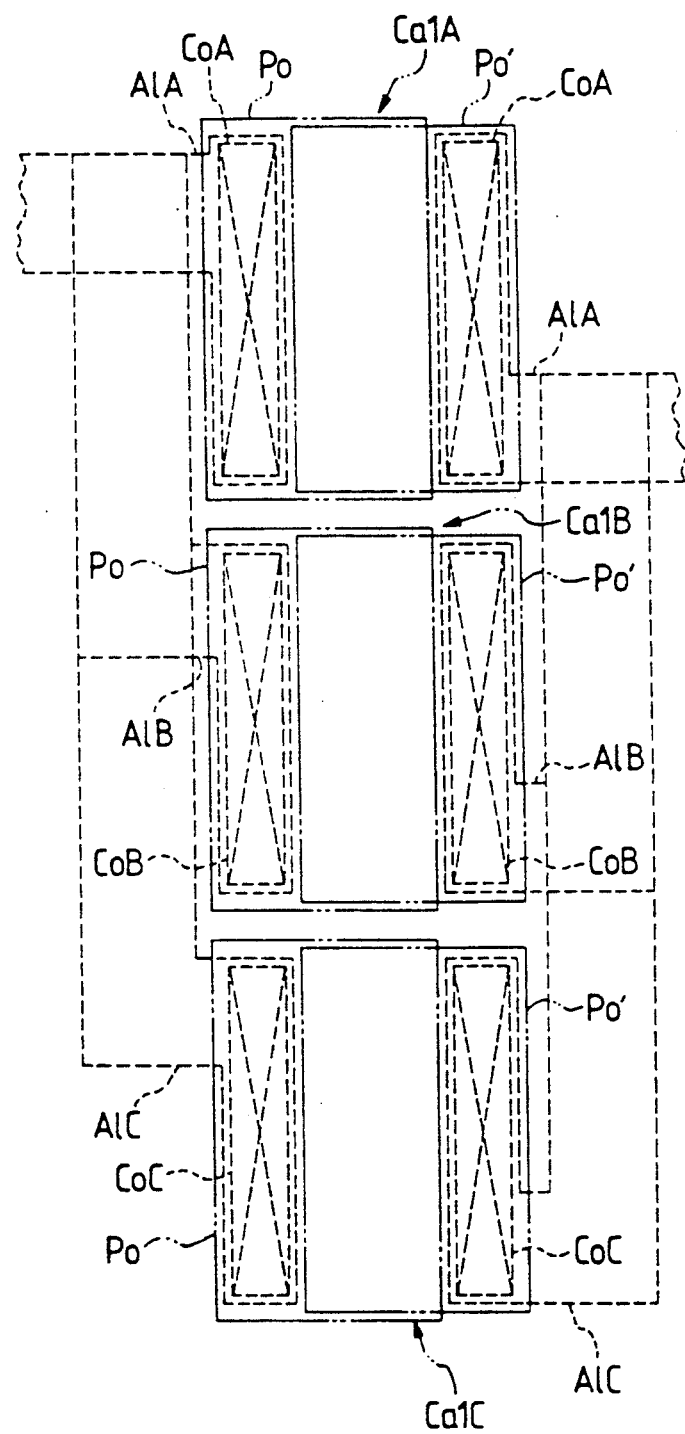

FIG. 11
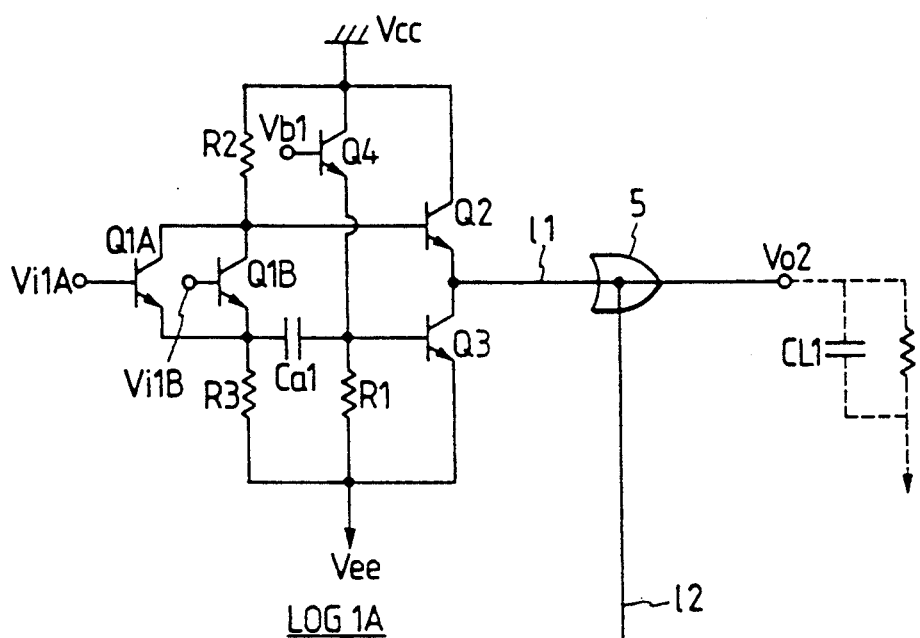
LOG 1A
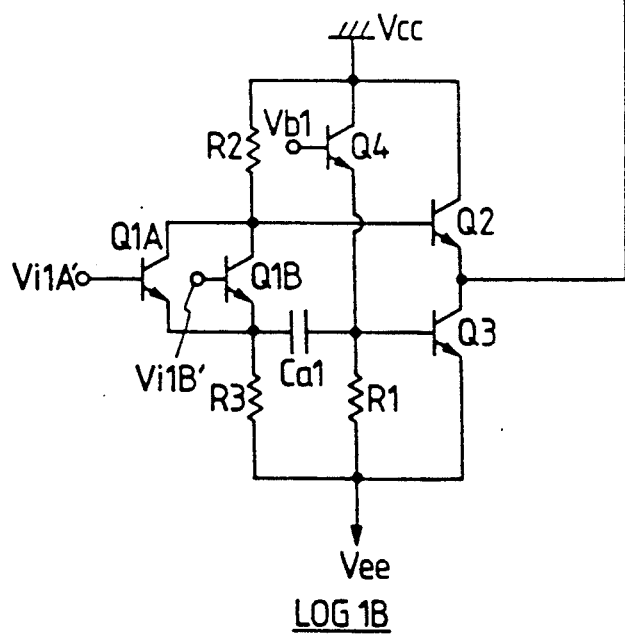
LOG 1B

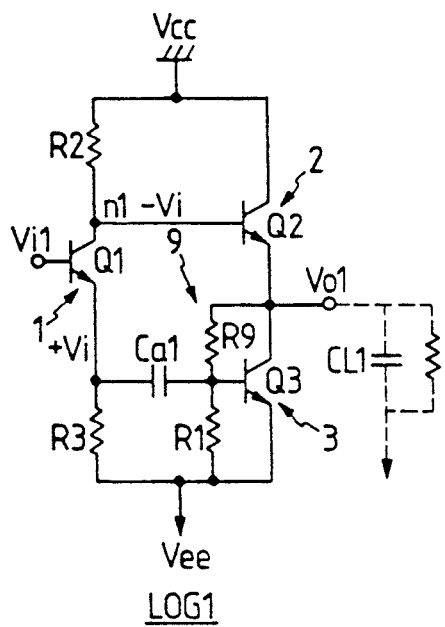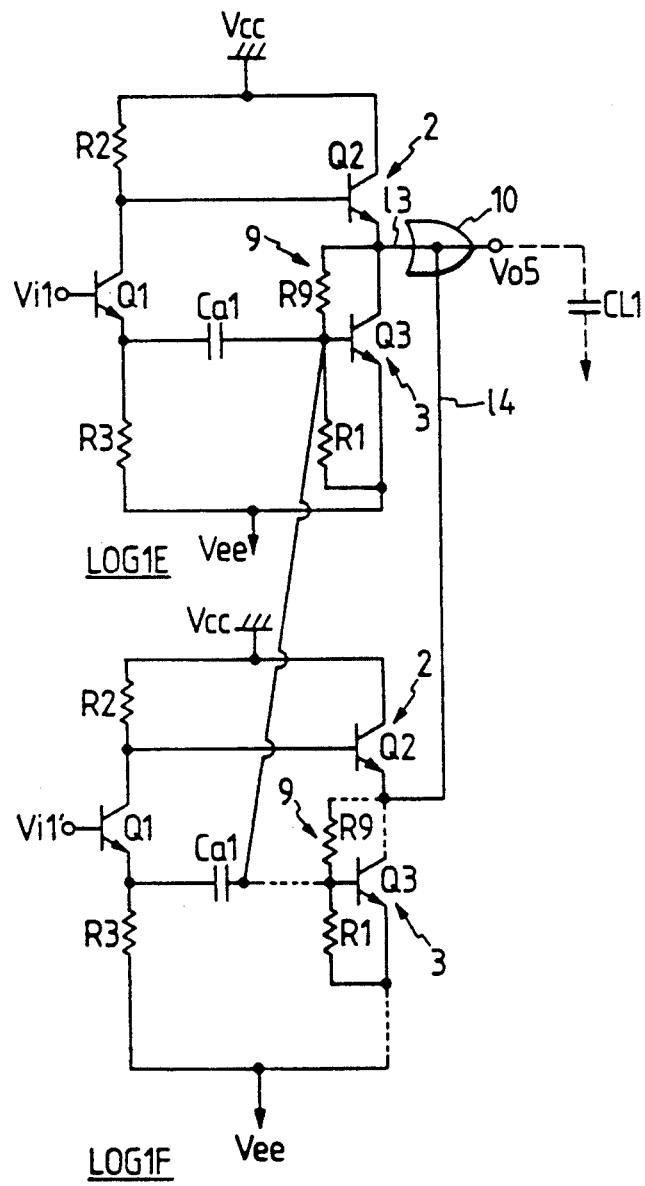

LOG1

LOG1

LOG1

LOG1

LOG3

LOG4

LOG5

LOG7

5,283,480

SEMICONDUCTOR INTEGRATED CIRCUIT DEVICE WITH A PLURALITY OF LOGIC CIRCUITS HAVING ACTIVE PULL-DOWN FUNCTIONS

The present invention is a continuation-in-part application of Ser. No. 330,461, now U.S. Pat. No. 4,999,520, filed in the United States Patent and Trademark Office on Mar. 30, 1989.

BACKGROUND OF THE INVENTION

The present invention relates to a logic circuit, particularly to the art effectively applied to a high speed logic circuit to be formed within a semiconductor integrated circuit, namely to the art effectively applied, for example, to NTL (Non-Threshold Logic), or ECL (Emitter Coupled Logic) and, moreover, to the art effectively applied to the basic logic circuit within a bipolar gate array integrated circuit (for example, refer to Nikkei Electronics, No. 420, pp. 117-120, May 4, 1987, Nikkei McGraw-Hill, Inc.).

The present invention also relates to a technique effective for use in an NTL or ECL circuit provided with an active pull-down circuit.

Some NTL and ECL circuits proposed receive low amplitude digital input signals and conduct high speed logic operations. Moreover, an NTL circuit has been proposed with an output emitter follower and an ECL circuit with an emitter follower formed by adding the output emitter follower circuit to an NTL circuit and an ECL circuit (hereinafter, the NTL circuit with an output emitter follower is called an NTL circuit and the ECL circuit with an output emitter follower is called an ECL circuit, respectively), a high speed logic integrated circuit comprising the basic configuration of the NTL circuit and the high speed logic circuit comprising the basic configuration of an ECL circuit and an NTL circuit.

FIG. 32 is a configuration example of the logic circuit of prior art.

The logic circuit $LOG_7$ shown in the same figure is formed as an NTL comprising a first transistor $Q_{36}$ forming a grounded emitter type phase inversion circuit and a second transistor $Q_{37}$ forming an emitter follower output circuit, and a negative logic output $V_{O10}$ can be obtained for an input $V_{I7}$ as shown in FIG. 33 by applying an inversion output extracted from the collector of transistor $Q_{36}$ to the base of transistor $Q_{37}$.

In this case, this logic circuit $LOG_7$ is provided with a collector load resistance $R_{34}$, an emitter bias resistance $R_{35}$, a speedup capacitance $C_{a8}$ for improving switching operation of transistor $Q_{36}$ and an emitter load resistance $R_{36}$ of transistor $Q_{37}$.

The NTL circuit is described, for example, in Japanese Patent Laid-Open No. 63-124615.

SUMMARY OF THE INVENTION

The inventors of the present invention, however, have found that the NTL circuit technique described above is accompanied by the following problems.

Namely, as the operation waveforms of logic circuit LOG; described are shown in FIG. 33, when the input $V_{I7}$ is changed to low level L from high level H and thereby the output $V_{O10}$ is changed to the high level H from the low level L, a load capacitance $CL_3$ is actively charged by the emitter follower operation of transistor $Q_{37}$ and thereby the output $V_{O10}$ can immediately be boosted up to the high level H from the low level L.

However, when the input $V_{I7}$ is changed to the high level H from the low level L and thereby the output $V_{O10}$ is changed to the low level L from the high level H, it is required to wait for the charge of load capacitance $CL_3$ to be passively discharged by the emitter load resistance $R_{36}$. Therefore, a comparatively longer delay time $t_{pd2}$ is generated at the change of output $V_{O10}$ to the low level L from the high level H.

In above logic circuit $LOG_7$, it is necessary for ensuring a short falling time of output $V_{O10}$ to sufficiently lower the resistance value of emitter load resistance $R_{36}$ of the transistor $Q_{37}$ to cause a discharge current $I_9$ from the load capacitance $CL_3$ to easily flow. However, when the value of emitter load resistance $R_{36}$ is lowered, a current steadily flowing into the emitter load resistance $R_{36}$ when the output $V_{O10}$ is high level H increases, also resulting in increase of current dissipation of the circuit.

As described above, the logic circuit described has a problem that it is difficult to simultaneously satisfy the low power consumption and high speed operation.

Moreover, a problem also rises that if the circuit elements are superminiaturized by the monolithic semiconductor integrated circuit technology since the logic circuit described, for example, is used as the basic logic circuit of a large capacity gate array integrated circuit, malfunction may easily be generated due to the influence of a-rays.

For the logic circuit formed by ECL, the improved circuit is indicated in the U.S. Pat. No. 4,539,493.

It is therefore an object of the present invention to provide a semiconductor integrated circuit which simultaneously satisfies a high speed characteristic and low power consumption. Another object of the present invention is to provide a semiconductor integrated circuit which is resistive to the influence of a-ray.

These and other objects and novel features of the present invention will be become apparent from the following description of the specification and the accompanying drawings of the present invention.

A typical disclosure of the present invention will be summarized hereinafter.

Namely, in the logic circuit forming NTL, the input circuit is formed by a phase split circuit, the emitter follower output circuit is driven with an inverted output of this phase split circuit, on the other hand, an emitter load of emitter follower output circuit is formed by a transistor and the emitter load transistor is temporarily conductively driven with a charging current of the capacitance which is charged by the rising edge of a non-inverted output of such phase split circuit.

According to the means described above, in the transition period wherein the emitter follower output circuit transistor is changed to the non-conductive from the conductive condition at the transition of input logic, the emitter load transistor of the emitter follower output circuit temporarily becomes conductive quickly discharging the load capacitance, and in the steady state other than the transition period, the emitter load transistor keeps an almost non-conductive state.

Thereby, the objects for simultaneously satisfying low power consumption and high speed characteristics, enabling the wired logic and receiving little influence from a-rays can be attained.

Moreover, according to investigations by the inventors of the present invention, the current circuit speed of the NTL circuit is 70 ps/gate (under the loading condition) but it may be improved in the future up to 30 ps/gate by applying the present invention to the logic circuit, namely the NTL circuit of FIG. 32. In addition, the power consumption of this NTL circuit may be lowered up to ⅓ to 1/5 in comparison with the ECL circuit of the prior art.

Furthermore, according to investigations by the inventors of the present invention, a logic circuit to which the present invention is applied is a low amplitude circuit and therefore realizes high speed operation. In addition, the power supply voltage of the logic circuit (logic part) to which the present invention is applied is a low voltage circuit (low voltage part) allowing a voltage as low as $-2.0 - -1.2$ V and therefore realizes low power supply voltage.

BRIEF DESCRIPTION OF THE DRAWINGS

FIG. 9 is a layout diagram indicating a plurality of differential capacitances included in the first logic circuit shown in FIG. 8;

FIG. 11 is a circuit diagram indicating the first application example of the first logic circuit shown in FIG. 10;

FIG. 16 is a second circuit diagram for realizing the first principle diagram of the first logic circuit shown in FIG. 1;

FIG. 17 is a circuit diagram indicating an application example of the first logic circuit shown in FIG. 16;

DESCRIPTION OF THE PREFERRED EMBODIMENTS

Figure 1:
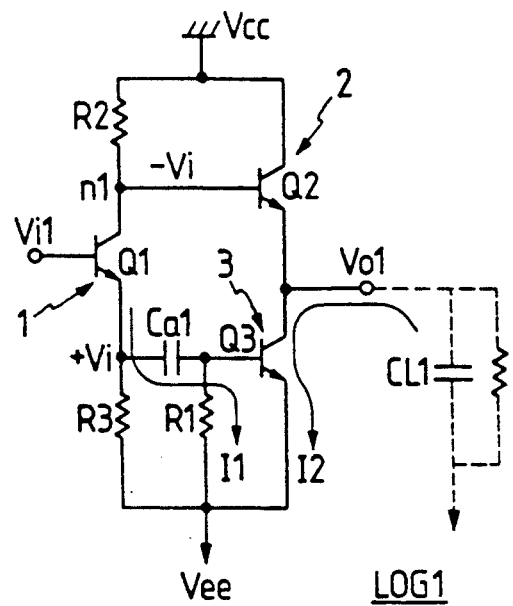
FIG. 1 illustrates the first principle of a first logic circuit to which the present invention is applied.
Figure 27:
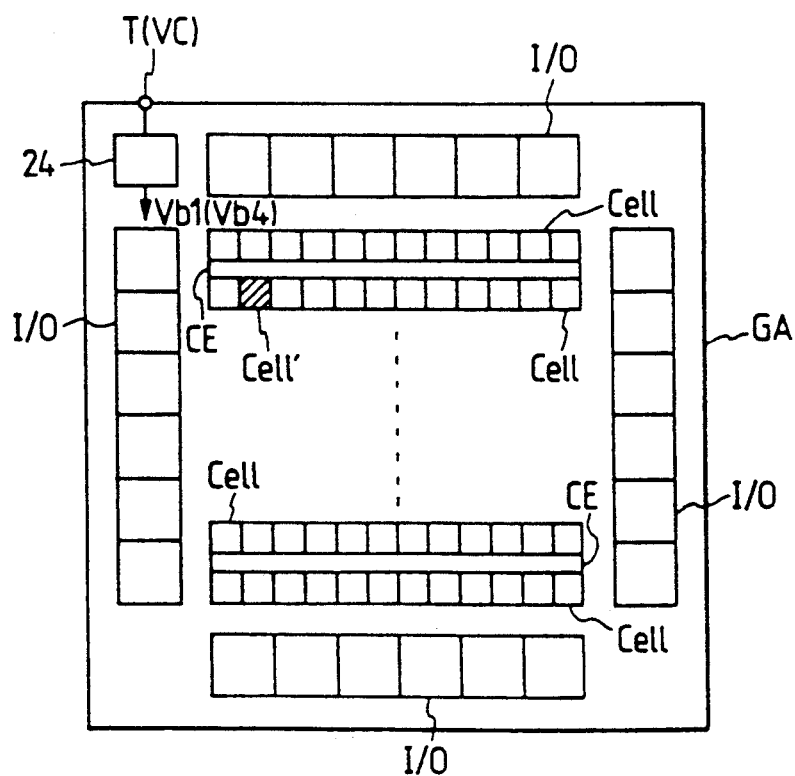
FIG. 27 is a schematic plan view indicating a large capacity gate array integrated circuit to which the present invention is applied.

FIG. 1 illustrates a first principle diagram of the first logic circuit to which the present invention is applied. In the following figures, the like elements are given the like numerals, a bipolar transistor shown is an NPN transistor, and logic circuits shown in the figures form, although not limited particularly, one of cells as the basic logic circuit of the large capacity gate array integrated circuit as shown in FIG. 27 described later, which is formed, together with the other cells, on a single P type semiconductor substrate such as a single crystal silicon. In FIG. 1, the logic circuit $LOG_1$ is formed by a phase split circuit 1, an emitter follower output circuit 2 which is driven by an inverted output $-V_i$ of this phase split circuit 1, an active pull-down circuit 3, and a differential capacitance $C_{al}$ which differentiates the rising edge of the non-inverted output $+V_i$ of the phase split circuit 1.

In this case, the phase split circuit 1 described is formed by a bipolar transistor $Q_1$, a collector load resistance $R_2$ located in series between the collector of such bipolar transistor $Q_1$ and a high level power source voltage $V_{cc}$ and an emitter load resistance $R_3$ located in series between the emitter of bipolar transistor $Q_1$ and a low level power source voltage $V_{ee}$.

The emitter follower output circuit 2 is formed by an emitter follower transistor $Q_2$. The emitter of emitter follower transistor $Q_2$ is connected to the low level power source voltage $V_{ee}$ through the pull-down transistor $Q_3$ described later and simultaneously with a load capacitance $CL_1$ generated equitably by distributed capacitance of an output lead wire and input capacitance of logic circuit in the next stage.

The active pull-down circuit 3 is formed by the pull-down transistor $Q_3$, which is an emitter load of the emitter follower output circuit 2 and such differential capacitance $C_{al}$ is conductively driven temporarily by differentiating the rising edge of non-inverted output $+V_i$.

The differential capacitance $C_{al}$ is connected, at the one electrode, with the emitter of bipolar transistor $Q_1$ and, at the other electrode, with the base of pull-down transistor $Q_3$. The base of pull-down transistor $Q_3$ is connected in parallel with a resistance $R_1$. This resistance $R_1$ forms, together with the differential capacitance $C_{al}$, a differential time constant and simultaneously a discharge path for the remaining charge of the base of pull-down transistor $Q_3$.

To the base of bipolar transistor $Q_1$ forming the phase split circuit 1, the digital input signal $V_{i1}$ is supplied from the other logic circuits not illustrated in the large capacity gate array integrated circuit. Here, the power source voltage $V_{cc}$ of circuit is set to the ground potential, while the power source voltage $V_{ee}$ of circuit is set to a predetermined negative power source voltage (for example, $-2$ V). Moreover, the digital input signal $V_{i1}$ is given comparatively small signal amplitude, for example, with the high level $V_H$ thereof set to $-0.8$ V or with the low level $V_L$ to $-1.4$ V.

Figure 2:
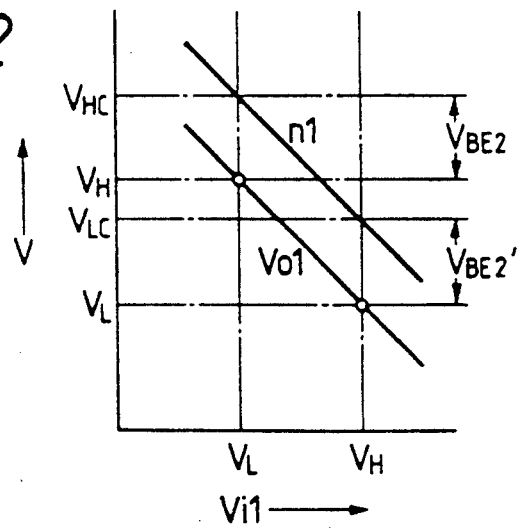
FIG. 2 is an input/output characteristic diagram of the first logic circuit of FIG. 1.

FIG. 2 is an input/output characteristic graph of the logic circuit $LOG_1$ shown in FIG. 1. In FIG. 2, the level of digital Output signal $V_{O1}$ of the logic circuit $LOG_1$ shown in FIG. 1 will be explained.

When the digital input signal $V_{i1}$ is set to the predetermined low level $V_L$, the collector current $I_{c1}$ of bipolar transistor $Q_1$ becomes a comparatively small Value as indicated below when the base emitter voltage of bipolar transistor $Q_1$ and current conduction rate are respectively designated as $V_{BE1}$ and $a_1$.

$$I_{cl} = (V_L - V_{BE1} - B_{ee}) \times a_1/a_3$$

In this case, a voltage of node $n_1$ is set to such a high level as $$V_{HC} = -R_2 \times I_{c1}$$

The high level $V_{HC}$ of node $n_1$ is further shifted as much as base emitter voltage $V_{BE2}$ of transistor $Q_2$ forming the output emitter follower circuit. Thereafter, the digital output signal $V_{o1}$ of the logic circuit $LOG_1$ is set to the high level as indicated below.

$$V_H = B_{HC} - V_{BE2}$$

The high level $V_H$ of digital output signal $V_{O1}$ is set to the high level $V_H$ of digital input signal by setting the collector load resistance $R_2$ and emitter load resistance $R_3$.

Meanwhile, the digital input signal $V_{o1}$ is set to the predetermined high level $V_H$, the collector current $I_{C1}$, of bipolar transistor $Q_1$ becomes a comparatively large value as indicated below when the base emitter voltage of bipolar transistor $Q_1$ and current conduction rate are defined respectively as $V_{BE1}$, and $a_1$,.

$$I_{cl'} = (V_H - V_{BE1}' - V_{ee}) \times a_1'/R_3$$

In this case, a voltage of node $n_1$ is set to a level as low as $$V_{LC} = -R_2 \times I_{cl'}$$

The low level $V_{LC}$ of node $n_1$ is set to the low level of digital output signal $V_{o1}$ of the logic circuit $LOG_1$ after it is shifted as much as the base emitter voltage $V_{BE2}$, of the emitter follower transistor $Q_2$. In this case, the low level $V_L$ of digital output signal $V_{O1}$ is indicated as $$V_L = V_{LC} - V_{BE2}'$$

The low level $V_L$ of the digital output signal $V_{o1}$ can be set to the low level $V_L$ of digital input signal $V_{i1}$ by setting the collector load resistance $R_2$ and emitter load resistance $R_3$.

Figure 3:
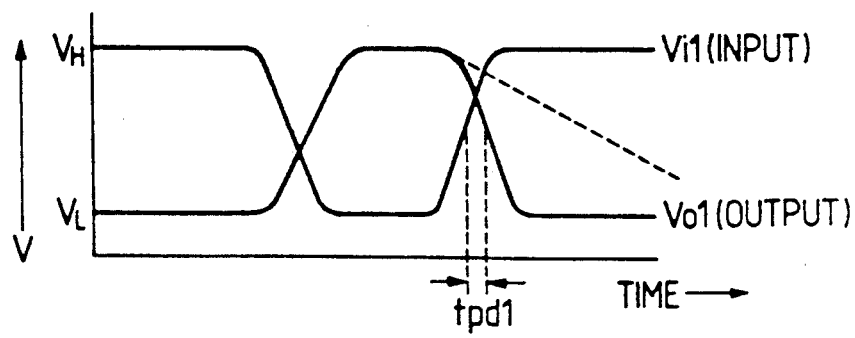
FIG. 3 illustrates waveforms operation examples of the first logic circuit of FIG. 1.

FIG. 3 illustrates waveforms indicating an operation example of the logic circuit $LOG_1$ shown in FIG. 1.

In FIG. 3, potentials of digital input signal $V_{i1}$ and digital output signal $V_{o1}$ are plotted on the vertical axis, while the time is shown on the horizontal axis.

As indicated in the same figure, when the digital input signal $V_{i1}$ changes to the low level $V_L$ from the high level $V_H$, the load capacitance $CL_1$ is quickly charged by the emitter follower operation of the emitter follower transistor $Q_2$. Thereby, the digital output signal $V_{o1}$ immediately rises up to the high level $V_H$ from the low level $V_L$ as in the case of the ECL circuit of the prior art.

When the digital input signal $V_{i1}$ changes to the high level $V_H$ from the low level $V_L$, a charging current $I_1$ of the differential capacitance $C_{al}$ flows toward the base of pull-down transistor $Q_3$ from the emitter of bipolar transistor $Q_1$. Thereby, the pull-down transistor $Q_3$ is temporarily conductively driven, quickly discharging the load capacitance $CL_1$. Namely, the differential capacitance $C_{al}$ differentiates the rising edge of non-inverted output $+V_i$ of the phase split circuit 1 and this differential output temporarily conductively drives the pull-down transistor $Q_3$. As a result, a large discharge current $I_2$ is extracted from the load capacitance $CL_1$ and the digital output signal $V_{o1}$ immediately drops to the low level $V_L$ from the high level $V_H$.

As described above, a delay time $t_{pd1}$ when the digital output signal $V_{o1}$ drops is sharply curtailed in the logic circuit LOG$_1$ described above and as shown in FIG. 3, the rising time becomes almost equal to the falling time of the digital output signal $V_{o1}$ and the differential output forces the pull-down transistor Q$_3$ to be driven temporarily and conductively. Therefore, the load driving capability becomes very high in case the load capacitance CL$_1$ is light and even in case it is heavy, and the input impulse response can be improved because the load driving capability is high. Accordingly, since the rising time of digital output signal $V_{o1}$ is almost equal to the falling time, dependency on input waveform of digital input signal $V_i$ for the circuit speed of logic circuit LOG$_1$ can be reduced and the pull-down transistor Q$_3$ equivalently forming the emitter load of emitter follower output circuit 2 is transitionally and conductively driven only when the digital input signal $V_{i1}$ changes to the high level $V_H$ from the low level $V_L$ while the digital output signal Vol changes to the low level $V_L$ from the high level $V_H$, and in the steady state other than the transition period, the pull-down transistor Q$_3$ inhibits the emitter current according to keeping almost non-conductive state. Thereby, the logic circuit LOG$_1$ described above attains the high speed characteristic simultaneously with low power consumption.

In addition, in the logic circuit LOG$_1$ described, the emitter load in the normal condition is equivalently in the high impedance condition and thereby a current flowing from the output load side is suppressed to a low level while the low level $V_L$ output is obtained. Thereby, it can be done easily to connect in common the outputs of a plurality of logic circuits to form a wired logic circuit.

Figure 4:
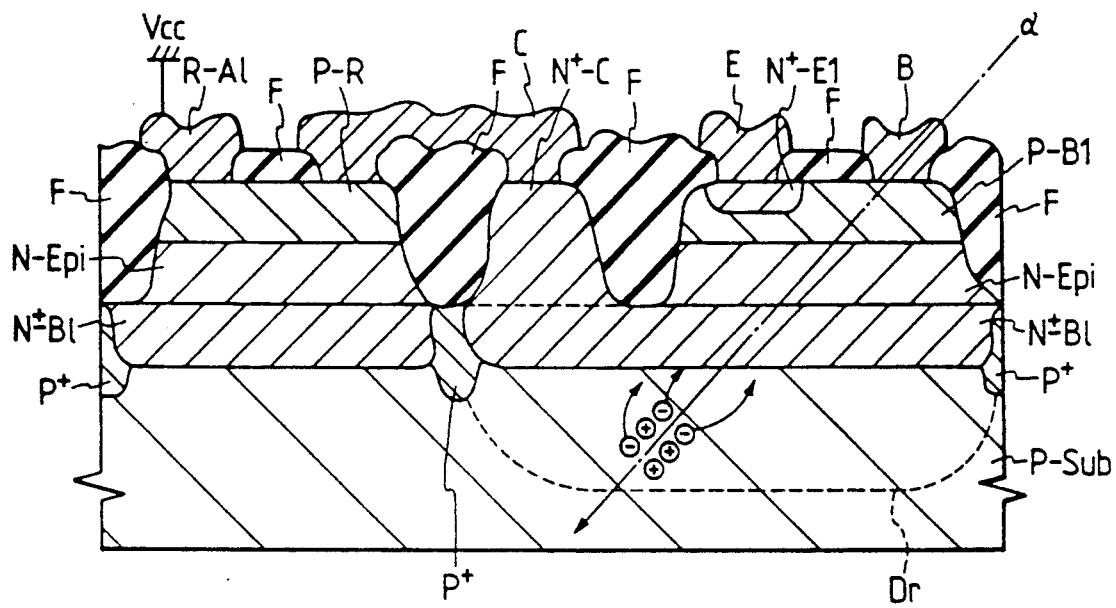
FIG. 4 is a sectional view of bipolar transistor and collector load resistance included in the first logic circuit shown in FIG. 1.

Moreover, in such logic circuit LOG$_1$, for example, even if the bipolar transistor Q$_1$ or Q$_3$ forming the phase split circuit 1 is effected by the $\alpha$-ray, such influence of a-ray can be alleviated as explained for FIG. 4.

FIG. 4 is a sectional view of a bipolar transistor Q$_1$ and collector load resistance R$_2$ of logic circuit LOG$_1$ shown in FIG. 1.

In FIG. 4, P-Sub designates P type semiconductor substrate; N+-B1, N+ type buried layer; N-E$_{pi}$, N type epitaxial layer; P-B1, base region of bipolar transistor Q$_1$; P-R, resistance layer of collector load resistance R$_2$; N+-E1, emitter region of bipolar transistor Q$_1$; N+-C, collector contact layer of bipolar transistor Q$_1$; p+, channel stop region; D$_r$, depletion layer region and F, field oxide film. B, E,C respectively designate aluminum electrodes of base, emitter and collector of the bipolar transistor Q$_1$. R-A1 designates the electrode of collector load resistance R$_2$ formed by aluminum and is connected to the power source voltage V$_{cc}$. The collector load resistance R$_2$ may also be formed by the polysilicon layer.

Under the steady condition, when the $\alpha$-ray $\alpha$ is incident to the bipolar transistor Q$_1$, the holes $\oplus$ and electrons $\ominus$ are generated in the depletion layer region D$_r$. The electrons $\ominus$ are collected to the collector region of bipolar transistor Q$_1$ having the higher potential, thereby providing the effect as it were applying a leak current to the P type semiconductor substrate from the collector region of the bipolar transistor Q$_1$. In this case, a virtual collector current generated by the $\alpha$-ray lowers the collector current of bipolar transistor Q$_1$ but almost does not have any effect on the emitter voltage of bipolar transistor Q$_1$ since the base voltage is constant. Accordingly, the pull-down transistor Q$_3$ maintains the non-conductive condition without receiving the effect of the $\alpha$-ray. While the pull-down transistor Q$_3$ sustains the non-conductive condition, the charges of load capacitance CL$_1$ are not discharged quickly even if only the collector voltage of bipolar transistor Q$_1$ is lowered temporarily by the $\alpha$-ray. Moreover, when the $\alpha$-ray is incident to the pull-down transistor Q$_3$, the collector voltage of pull-down transistor Q$_3$ is caused to become low as in the case of explanation about operation of pull-down transistor Q$_3$ for the $\alpha$-ray, but the collector of pull-down transistor Q$_3$ is clamped by operations of emitter follower transistor Q$_2$ and it does not drop largely. Therefore, the pull-down transistor Q$_3$ maintains the non-conductive condition and the charges of load capacitance CL$_1$ is not discharged quickly. In addition, it is impossible for the $\alpha$-ray entering the emitter follower transistor Q$_1$ (or pull-down transistor Q$_3$) to be incident to the pull-down transistor Q$_3$ (or bipolar transistor Q$_1$) from the characteristic of the $\alpha$-ray and it is almost far from possibility that a couple of $\alpha$-rays are respectively incident to the bipolar transistor Q$_1$ and pull-down transistor Q$_3$. Accordingly, the digital output signal $V_{o1}$ does not become low so much as drop of the collector voltage of bipolar transistor Q$_1$, for example, even When the $\alpha$-ray is incident to the bipolar transistor Q$_1$ or pull-down transistor Q$_3$. Namely, the influence of the $\alpha$-ray can be eased.

Figure 5:
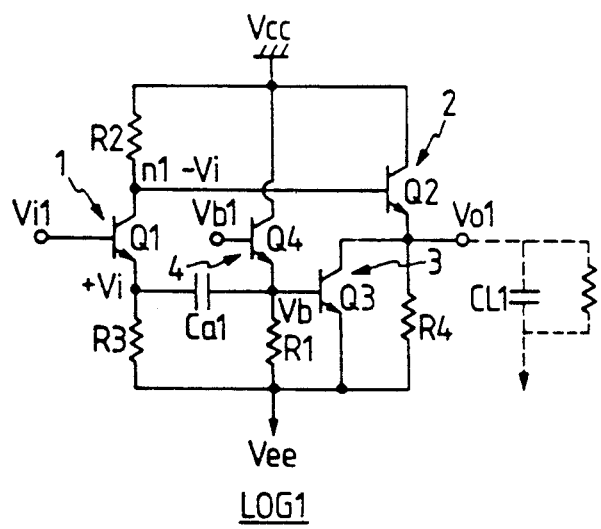
FIG. 5 is a first circuit diagram for realizing the first principle diagram of the first logic circuit shown in FIG. 1.
Figure 6:
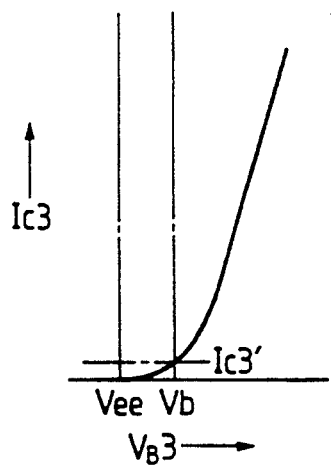
FIG. 6 is a characteristic graph indicating relationship between base voltage and collector current of a pull-down transistor included in the first logic circuit shown in FIG. 5.

FIG. 5 shows a first embodiment for realizing the logic circuit LOG$_1$ shown in FIG. 1 with the present invention. FIG. 6 illustrates the characteristic graph for explaining the relationship between the base voltage $V_{B3}$ and collector current $I_{C3}$ of the pull-down transistor Q$_3$ included to the logic circuit LOG$_1$ shown in FIG. 5.

Explanation will be made focusing on the difference from FIG. 1. In the logic circuit LOG$_1$ of an embodiment shown in the same figure, although not limited particularly, the collector load resistance R$_2$, emitter load resistance R$_3$ and resistance R$_1$ are respectively set to 3 k$\Omega$, 2 k$\Omega$ and 40 k$\Omega$ and the differential capacitance C$_{a1}$ is set to 0.2 PF. Moreover, in this embodiment, a high resistance R$_4$ of 20 k$\Omega$ is provided for stabilizing the emitter voltage of the emitter follower transistor Q$_2$ in the steady state. Moreover, a bias circuit 4 which biases the pull-down transistor Q$_3$ in the steady state to the condition just before the conductive condition is also provided. This bias circuit 4 is formed by the bipolar transistor Q$_4$ to which the predetermined base control voltage V$_{b1}$ supplied from the external or internal circuit of the cell formed by the logic circuit LOG$_1$ is applied and the predetermined bias voltage V$_b$ is supplied to the base of pull-down transistor Q$_3$.

Here, the predetermined base control voltage V$_{b1}$ to be supplied to the base of bipolar transistor Q$_4$ is set to such a predetermined voltage as will provide a voltage value for setting the pull-down transistor Q$_3$ to the very weak ON condition, namely the bias voltage V$_b$ which is generated the collector current I$_{c3}$ of the pull-down transistor Q$_3$ to Ic3' (for example, 10–100 $\mu$A) as shown in FIG. 6.

Thereby, if the driving sensitivity of pull-down transistor Q$_3$ is enhanced and the capacitance value of the differential capacitance C$_{a1}$ is lowered to a small value, the pull-down transistor Q$_3$ is reliably driven conductively and the load capacitance CL$_1$ can be quickly discharged at the transition time where the digital input signal V$_{o1}$ is changed to the high level V$_H$ from the low level V$_L$.

As described, the falling time of the digital output signal $V_{o1}$ to the low level $V_L$ from the high level $v_H$ is further shortened and moreover the load capacitance $CL_1$ Can be discharged more quickly even in case the load capacitance $CL_1$ is a heavy load. Moreover, a conductive driving level of the pull-down transistor $Q_3$ is determined by a capacitance value of differential capacitance $C_{a1}$ and the voltage value of bias voltage $V_b$. Namely, the load driving capability of the logic circuit $LOG_1$ can be controlled by changing the capacitance value of differential capacitance $C_{a1}$ or the voltage value of base control voltage $V_{b1}$ of bipolar transistor $Q_4$ and the falling rate of digital output signal $V_{o1}$ can also be controlled. The high impedance resistance $R_4$ for stabilizing emitter voltage of emitter follower transistor $Q_2$ in the steady state is not always required in case the base control voltage $V_{b1}$ of the bipolar transistor $Q_4$ is set to a constant value.

Figure 7A:
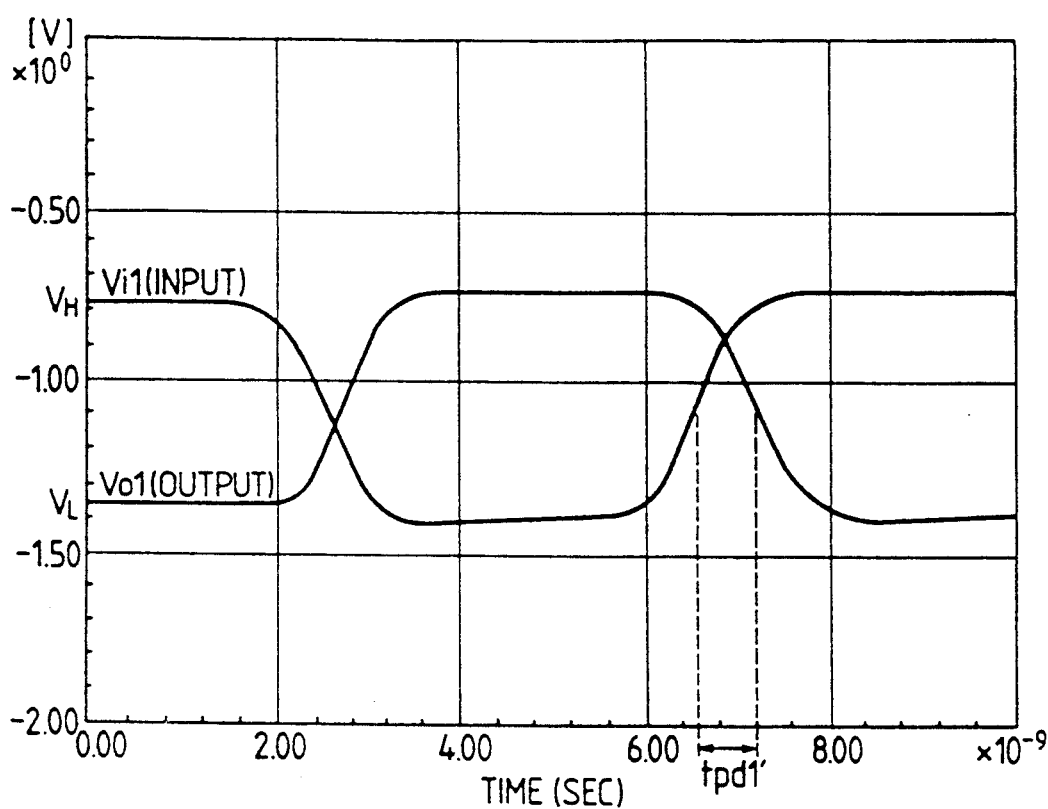
FIG. 7A illustrates waveforms indicating the simulation of the input and output signals of the first logic circuit shown in FIG. 5.
Figure 7B:
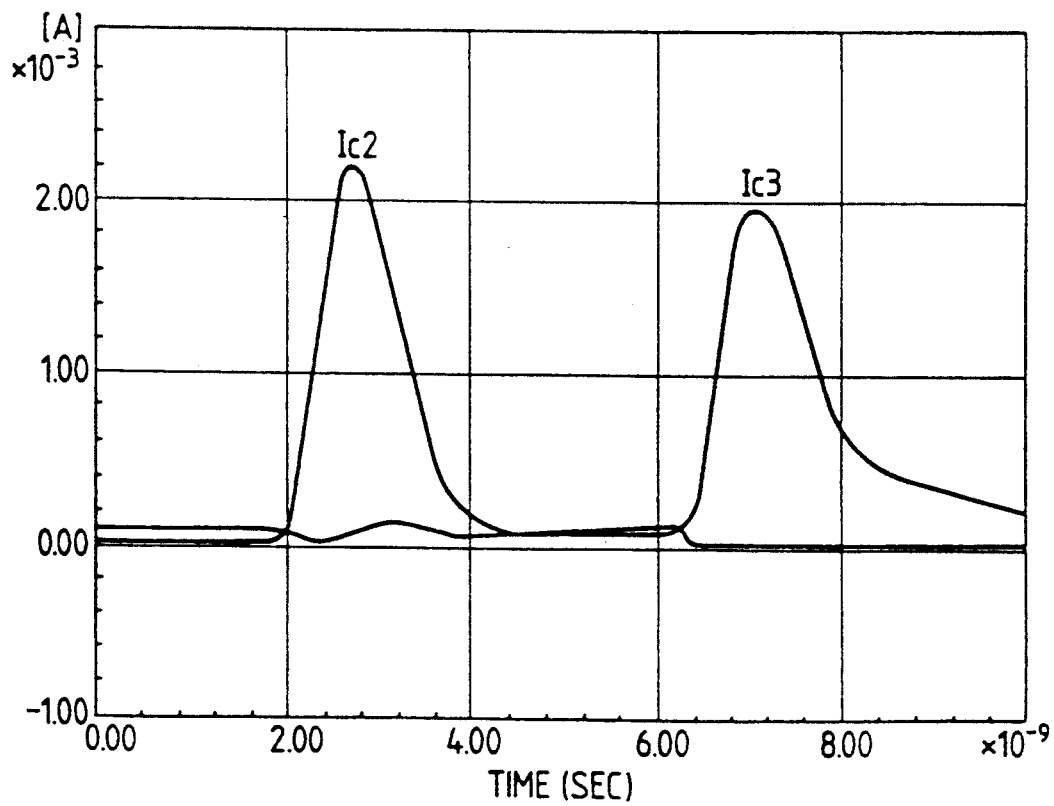
FIG. 7B illustrates waveforms indicating relationship between collector current of emitter follower transistor and collector current of pull-down transistor included in the first logic circuit shown in FIG. 5 during the simulation operation.

FIG. 7A illustrates waveforms indicating the simulation of input and output signals of the logic circuit $LOG_1$ shown in FIG. 5. FIG. 7B also illustrates waveforms indicating the collector current of emitter follower transistor $Q_2$ and the collector current of pull-down transistor $Q_3$ during the simulation.

In such simulation, the collector load resistance $R_2$ is set to 1.9 kΩ, emitter load resistance $R_3$ to 1.3 kΩ, resistance $R_1$ to 20 kΩ, differential capacitance $C_{a1}$ to 0.7 PF, load capacitance $CL_1$ to 3 PF, base control voltage $V_{b1}$ to $-0.52$ V, power source voltage $V_{cc}$ to 0 V and power source voltage $V_{ee}$ to $-1.985$ V. The high resistance $R_4$ shown in FIG. 5 is not provided for this simulation.

In FIG. 7A, the time is plotted on the horizontal axis in the unit of seconds. On the other hand, the voltage of digital input signal $V_{i1}$ and digital output signal $V_{o1}$ is plotted on the vertical axis in the unit of volts. The digital input voltage $V_{i1}$ and digital output signal $V_{o1}$ respectively include some errors as shown in the waveforms of FIG. 7A, and the high level or low level including such errors are also respectively indicated as the high level $V_H$ and low level $V_L$ in FIG. 7A. In FIG. 7B, the horizontal axis indicates the time like FIG. 7A in the unit of second and the current of vertical axis indicates the collector current $I_{c2}$ of emitter follower transistor $Q_2$ and collector current $I_{c3}$ of pull-down transistor $Q_3$ in the unit of amperes.

In FIG. 7A and FIG. 7B, when the digital input signal $V_{i1}$ changes to the high level $V_H$ from the low level $V_L$, the collector current $I_{c2}$ quickly increases due to the emitter follower operation of the emitter follower transistor $Q_2$ and thereby the load capacitance $CL_1$ is quickly charged, followed by the digital output signal $V_{o1}$ rising up immediately to the high level $V_H$.

When the digital input signal $V_{i1}$ changes to the high level $V_H$ from the low level $V_L$, the pull-down transistor $Q_3$ is temporarily driven conductively With an output of the differential capacitance $C_{a1}$ as described previously and thereby the collector Current $I_{c3}$ of pull-down transistor $Q_3$ quickly increases and the load capacitance $CL_1$ is quickly discharged. Therefore, the digital output signal $V_{o1}$ falls to the lOw level $V_L$ from the high level $V_H$ with a delay time $t_{pd1'}$ of about $0.6 \times 10^{-9}$ sec.

Figure 8:
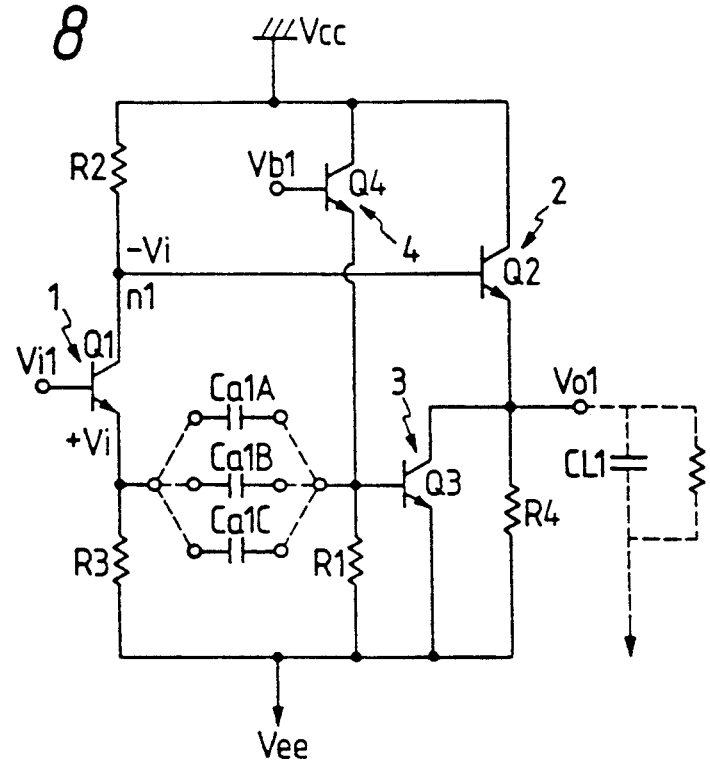
FIG. 8 is a circuit diagram providing a plurality of differential capacitances in the first logic circuit shown in FIG. 5.

FIG. 8 indicates an embodiment providing a plurality of differential capacitances in the logic circuit $LOG_1$ shown in FIG. 5. FIG. 9 illustrates a layout of a plurality of differential Capacitances shown in FIG. 8.

Explanation will now be made hereunder focusing on the difference from the embodiment of FIG. 5 with reference to FIG. 8. In the logic circuit $LOG_1$ shown in the same figure, the differential Capacitances $C_{a1A}$, $C_{a1B}$ and $C_{a1C}$ are provided in place of the differential capacitance $C_{a1}$.

In FIG. 9, the regions Po and Po' enclosed by a broken line indicate the polysilicon layer, respectively. $A_{1A}$–$A_{1C}$ indicate wirings formed by the aluminum layer and $C_{oA}$–$C_{oC}$ indicate contact holes.

The differential capacitances $C_{1A}$, $C_{1B}$ and $C_{1C}$ are respectively formed in the doubled polysilicon layers formed from the polysilicon layers Po, Po', interposing dielectric films not illustrated. The wirings $A_{1A}$–$A_{1C}$ and contact holes $C_{oA}$–$C_{oG}$ coupled with the differential capacitances $C_{a1A}$, $C_{a1B}$ and $C_{a1C}$ are selected by CAD (Computer Aided Design) and DA (Design Automation). The differential capacitances $C_{a1A}$, $C_{a1B}$ or $C_{a1C}$ are coupled between the emitter of bipolar transistor $Q_1$ and the base of pull-down transistor $Q_3$ with the mask to form the pattern of selected wirings $A_{1A}$, $A_{1B}$ or $A_{1C}$ and contact holes $C_{oA}$, $C_{oB}$ or $C_{oG}$.

As described above, the logic circuit $LOG_1$ can select adequate load driving capability and falling rate of the digital output signal $V_{o1}$ for the load capacitance $CL_1$ by selecting the differential Capacitances $C_{a1A}$, $C_{a1B}$ or $C_{a1C}$.

Figure 10:
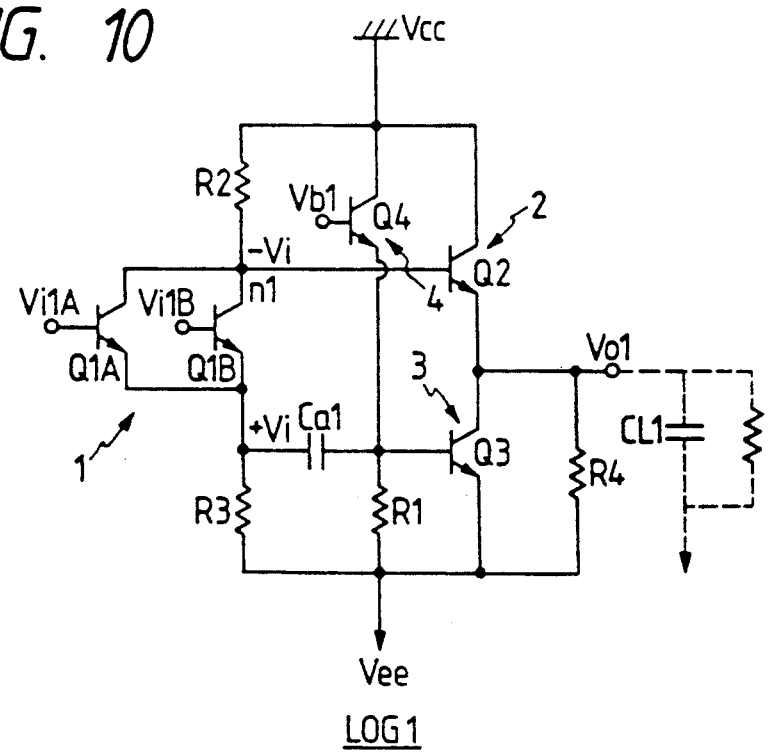
FIG. 10 is a circuit diagram indicating application example of the first logic circuit shown in FIG. 5.

FIG. 10 shows an embodiment indicating an application example Of the logic Circuit $LOG_1$ shown in FIG. 5 to which the present invention is applied.

Focusing to difference from FIG. 5, in the logic circuit $LOG_1$, the bipolar transistor $Q_1$ forming the phase split circuit 1 comprises the bipolar transistors $Q_{1A}$ and $Q_{1B}$ forming a 2-input logic circuit and the digital input Signals $V_{i1A}$ and $V_{i1B}$ are respectively supplied to the bases of bipolar transistors $Q_1A$ and $Q_{1B}$.

Operations of embodiment shown in FIG. 10 will then be explained hereunder.

When the digital input signals $V_{i1A}$ and $V_{i1B}$ are all set to the low level $V_L$, the voltage of emitters connected in common of the bipolar transistors $Q_{1A}$ and $Q_1$ B becomes the low level and a comparatively small collector current flows into the collector load resistance $R_2$. Therefore, the node $n_1$ becomes high level $V_{HC}$ like the embodiment of FIG. 1, while the digital output signal $V_{o1}$ becomes predetermined high level $V_H$.

On the other hand, any one of the digital input Signals $V_{i1A}$ and $V_{i1B}$ becomes high level $V_H$, the voltage of emitters connected in common of the transistors $Q_{1A}$ and $Q_{1B}$ becomes high level and a comparatively large collector current flows into the collector load resistance $R_2$. Thereby, the digital Output signal $V_{o1}$ is set to the predetermined low level $V_L$.

Namely, the logic circuit $LOG_1$ of this embodiment functions as the 2-input NOR gate circuit in which the digital output signal $V_{o1}$ satisfies following logical expression.

$$\overline{V_{ol}} = \overline{V_{i1A} \cdot V_{i1B}}$$
$$= \overline{V_{i1A} + V_{i1B}}$$

As described above, in the embodiment of FIG. 5, the bipolar transistor $Q_1$, of the logic circuit $LOG_1$, forming the phase split circuit 1 is provided in parallel and these are replaced by a couple of transistors $Q_{1A}$ and $Q_{1B}$ which respectively receive the digital input Signals $V_{i1A}$ and $V_{i1B}$ corresponding to the bases of these transistors. When the digital input signals $V_{i1A}$ and $V_{i1B}$ are all low level $V_L$, the digital output signal $V_{o1}$ is set selectively to the high level $V_H$ and thereby the logic circuit $LOG_1$ of this embodiment functions as the 2-input NOR gate. It is natural that the logic circuit $LOG_1$ realizes low power consumption, like the embodiment of FIG. 1, without interference on the high operation rate. In addition, with increase or decrease in the number of bipolar transistors provided in parallel, the NOR gate circuit having a desired fan-in number can be realized.

FIG. 11 illustrates a first application example comprising a wired logic 5 by connecting a couple of 2-input logic circuits $LOG_1$ shown in FIG. 10, as described, as the cell of large capacity gate array integrated circuit. In FIG. 11, the resistance $R_4$ shown in FIG. 10 may also be provided separately, although not illustrated. Moreover, since a pair of logic circuits $LOG_1$ are indicated, the one is designated as $LOG_{1A}$ and the other as $LOG_{1B}$. Moreover, the digital input signals $V_{i1A}$, $V_{i1B}$ are also indicated in the manner that the digital input signals of logic circuit $LOG_{1A}$ as $V_{i1A}$, $V_{i1B}$ and the digital input signals of logic $LOG_{1B}$ as $V_{i1A'}$, $V_{i1B'}$, corresponding to the logic circuits $LOG_{1A}$, $LOG_{1B}$.

As is already described, the emitter load is equivalently in the high impedance during the steady state and a current flowing from the load side during output of the low level $V_L$ is suppressed to a small level. Thereby, it can be realized easily to form a wired logic 5 by connecting in common the respective outputs without flowing of a steady current to the wires $l_i$ and $l_2$. Namely, the digital output signal $V_{o2}$ indicated below can be realized by forming the wired logics.

$$V_{o2} = \overline{(V_{i1A} + V_{i1B}} + \overline{V_{i1A'} + V_{i1B'})}$$

Moreover, if the wires $l_1$ and $l_2$ are formed by aluminum, for example, the electromigration is not easily generated because a steady current does not flow and thereby superminiaturization of wires $l_1$ and $l_2$ can be realized and in addition high speed operation and high integration density of large capacity gate array integrated circuit can also be realized.

The electromigration is explained, for example, on page 393, of the book entitled "SEMICONDUCTOR DEVICE BASIC THEORY AND PROCESS TECHNOLOGY", issued on May 25, 1987, SANGYO TOSHO Inc.

Figure 12:
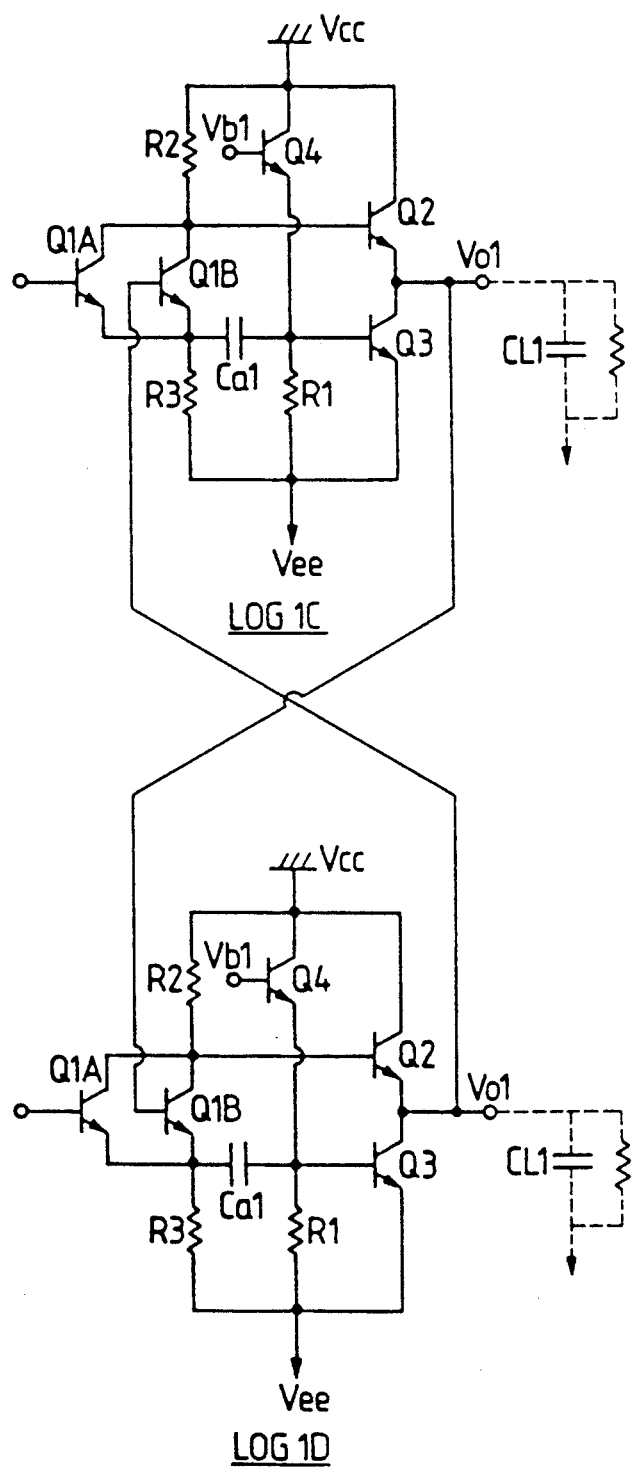
FIG. 12 is a circuit diagram indicating the second application example of the first logic circuit shown in FIG. 10.

FIG. 12 is a second application example comprising a latch circuit using a pair of 2-input logic circuit $LOG_1$ shown in FIG. 10 as the cell of the large capacity gate array integrated circuit as described previously.

In FIG. 12, the resistance $R_4$ shown in FIG. 10 may also be provided separately, although not illustrated. Moreover, a pair of logic circuits $LOG_1$ are provided in FIG. 12 and the one is designated as $LOG_{1C}$, while the other as $LOG_{1D}$.

As is already described, both logic circuits $LOG_{1C}$, $LOG_{1D}$ assure the storing operations with very high reliability because the digital output signal $V_{o1}$ does not easily receive the influence of α-ray.

Figure 13:
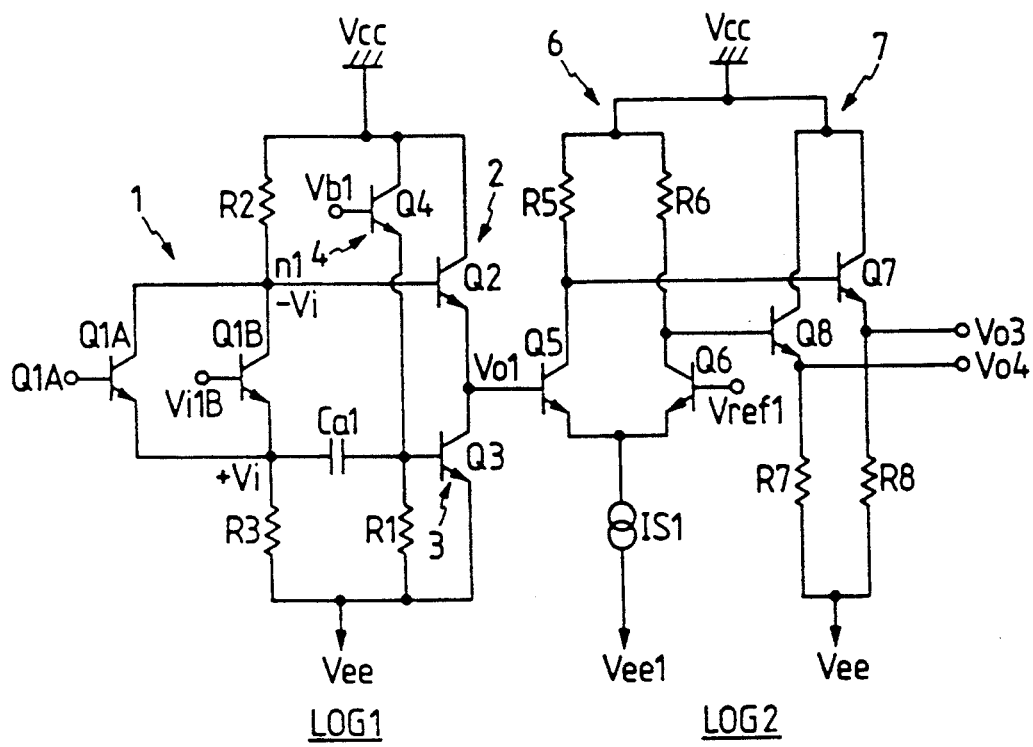
FIG. 13 is a circuit diagram coupling the first logic circuit shown in FIG. 10 to another logic circuit.

FIG. 13 indicates an embodiment in which the logic circuit $LOG_1$ shown in FIG. 10 and the logic circuit $LOG_2$ forming the ECL are respectively combined as the cells of large capacity gate array integrated circuit.

In FIG. 13, the logic circuit $LOG_2$ is formed by differential transistors $Q_5$ and $Q_6$ coupled between the power source voltage $V_{cc}$ and power source voltage $V_{ee'}$ differential amplifier circuit 6 formed by resistances $R_5$, $R_6$ and constant current source $IS_1$ and emitter follower output circuit 7 formed by bipolar transistors $Q_7$ and $Q_8$ which are coupled between the power source voltage $V_{cc}$ and power source voltage $V_{ee}$ and receive output of the differential amplifier circuit 6 and resistances $R_7$ and $R_8$. Moreover, the digital output signal $V_{o1}$ of logic circuit $LOG_1$ is supplied to the base of bipolar transistor $Q_5$ and the reference voltage $V_{ref1}$ to the base of bipolar transistor $Q_6$. In the logic circuit $LOG_1$, the high resistance $R_4$ of FIG. 10, although not illustrated, may be provided by different manner. The power source voltage $V_{ee'}$ is set to the predetermined negative voltage and for example set to $-3$ V.

Operations of the logic circuits $LOG_1$, $LOG_2$ in the embodiment of FIG. 13 are explained hereunder.

The logic circuit $LOG_1$ is the same as the embodiment shown in FIG. 10 and therefore it is omitted here. When the digital output signal $V_{o1}$ of logic circuit $LOG_1$ is in the high level $V_H$, it conductively drives the bipolar transistor $Q_5$ because it is higher than the potential of reference voltage $V_{ref1}$ and the digital output signals $V_{o3}$, $V_{o4}$ of the emitter follower output circuit 7 respective become the low level $V_L$ and high level $V_H$. When the digital output signal $V_{o1}$ of logic circuit $LOG_1$ is low level $V_L$, it conductively drives the bipolar transistor $Q_6$ because it is lower than the reference voltage $V_{ref1}$ and the digital output signals $V_{o3}$, $V_{o4}$ of the emitter follower output circuit are respectively output as the high level $V_H$ and low level $V_L$.

The logic circuit $LOG_1$ and the logic circuit $LOG_2$ forming ECL can be arranged simultaneously on a semiconductor substrate of the large capacity gate array integrated circuit by adequately providing the resistances $R_1$-$R_8$ in order to assure compatibility of the logic amplitudes of the high level and low level of the digital output signal $V_{o1}$ of the logic circuit $LOG_1$ and the logic amplitude of the logic circuit $LOG_2$.

Figure 14:
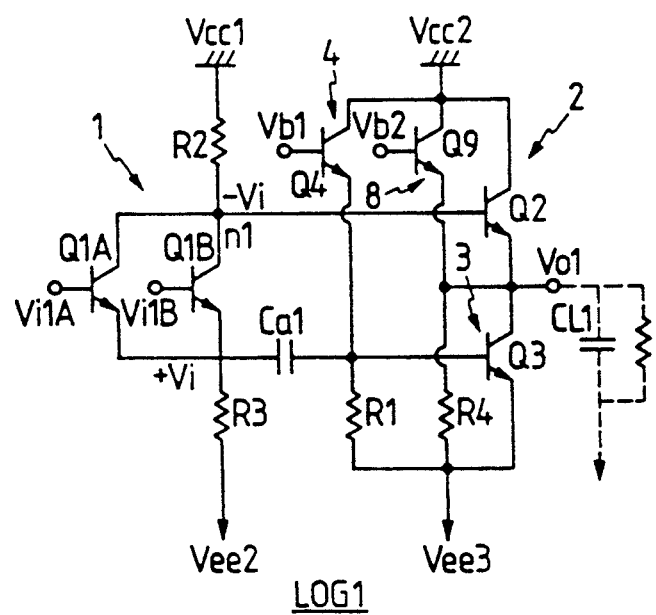
FIG. 14 is a circuit diagram stabilizing an output of the first logic circuit shown in FIG. 10.
Figure 15:
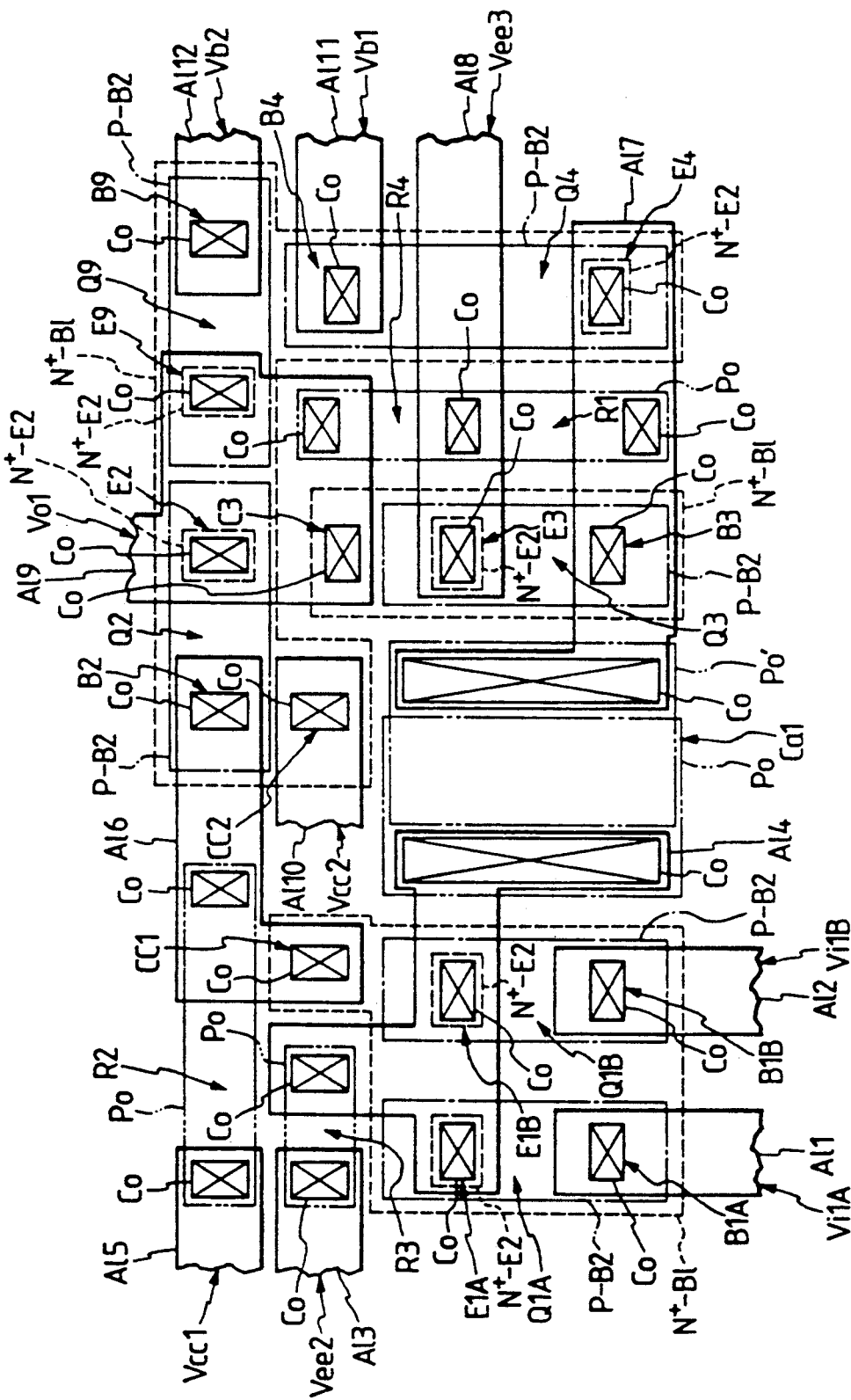
FIG. 15 is a layout of the first logic circuit shown in FIG. 14.

FIG. 14 indicates an embodiment for stabilizing outputs of logic circuit $LOG_1$ shown in FIG. 10. FIG. 15 is a layout of the logic circuit $LOG_1$ shown in FIG. 14.

In FIG. 14, explanation is made focusing on the difference from FIG. 10. The logic circuit $LOG_1$ comprises a bias circuit 4 for biasing the pull-down transistor $Q_3$ in the steady state to the condition just before the conductive condition and a clamp circuit 8 to prevent overshoot of the digital Output signal $V_{o1}$ to the negative voltage side which may be generated when the pull-down transistor temporarily becomes conductive and the discharge current at this time is extracted excessively. Moreover, a pair of power supply lines are respectively provided for the power source voltages $V_{cc}$ and $V_{ee}$ in order to prevent malfunction by conductivity at the steady state of the pull-down transistor $Q_3$ due to variation of power source voltages $V_{ee}$ and $V_{cc}$ depending on temperature characteristic of the power supply lines of power source voltages $V_{ee}$ and $V_{cc}$, and the power source voltages supplied from respective power supply lines are indicated as $V_{cc1}$, $V_{cc2}$, $V_{ee2}$ and $V_{ee3}$.

The clamp circuit 8 is formed by the bipolar transistor $Q_9$ to which the predetermined base control voltage $V_b$ of low impedance is applied from the logic circuit not illustrated, and the voltage of digital Output signal $V_{o1}$ is boosted above the low level $V_L$ with the emitter follower operation of transistor $Q_9$.

In FIG. 15, N+-B1 of the region enclosed by the dotted line designates N+ type burred layer; N+-E2, the emitter region of corresponding bipolar transistors. The region P-B2 enclosed by a broken line designates the base region of corresponding bipolar transistor; the regions Po, Po' enclosed by the broken line respectively designate the polysilicon layer, the region enclosed by a solid line designates the wirings $Al_1$-$Al_{12}$ formed by aluminum, and each Co, the contact hole. $B_1$-$B_4$ and $B_9$, $E_1$-$E_4$ and $E_9$ designate the base and emitter of the bipolar transistors $Q_1$-$Q_4$ and $Q_9$; $C_3$ is collector of the emitter follower transistor $Q_3$; $CC_1$ and $CC_2$ designate the common collectors described later. The collector load resistance $R_2$ is not a resistance formed by the diffused layer shown in FIG. 4 but the resistance formed by the polysilicon layer.

In FIG. 15, the digital input signals $V_{i1A}$ and $V_{i1B}$ are supplied to the bases $B_{1A}$ and $B_{1B}$ of bipolar transistors $Q_{1A}$, $Q_{1B}$ through the corresponding wirings $Al_i$ and $Al_2$ formed by aluminum layer. The power source voltage $V_{ee2}$ is coupled to the emitters $E_{1A}$ and $E_{1B}$ of the bipolar transistors $Q_{1A}$, $Q_{1B}$ through the wirings $Al_3$ and $Al_4$ formed by aluminum layer and the load resistance $R_3$ formed by the polysilicon layer $P_o$. Moreover, these emitters $El_A$, $El_B$ are also coupled to the one electrode of differential capacitance $C_{al}$ through the wiring $Al_4$ formed by the aluminum layer. The collectors of bipolar transistors $Q_{1A}$, $Q_{1B}$ are formed as the common collector $CC_1$ and is connected to the power source voltage $V_{cc}$ through the wirings $Al_5$ and $Al_6$ and collector load resistance $R_2$ formed by the polysilicon layer $P_o$. This common collector $CC_1$ is coupled to the base $B_2$ of emitter follower transistor $Q_2$ through the wiring $Al_6$ formed by the aluminum layer.

The differential capacitance $C_{al}$ is formed by interposing a dielectric film not illustrated between the doubled polysilicon layers formed by the polysilicon layers $P_o$, $P_{o'}$ and the one electrode of the differential capacitance $C_{al}$ is coupled to the emitters $E_{lA}$ and $E_{lB}$ of the bipolar transistors $Q_{lA}$, $Q_{lB}$ and emitter load resistance $R_3$ through the wiring $Al_4$ formed by the aluminum layer. The other electrode of differential capacitance $C_{al}$ is coupled to the base $B_3$ of pull-down transistor $Q_3$, resistance $R_1$ formed by polysilicon layer $P_o$ and emitter $E_4$ of bipolar transistor $Q_4$ through the wiring $Al_7$ formed by the aluminum layer.

The pull-down transistor $Q_3$ is connected, at its base $B_3$, to the differential capacitance $C_{al}$, resistance $R_1$ and emitter $E_r$ of bipolar transistor $Q_4$ through the wiring $Al_7$ formed by the aluminum layer, as described above. The emitter $E_3$ of pull-down transistor $Q_3$ is connected to the power source voltage $V_{ee3}$ and the resistance $R_1$ formed by the polysilicon layer $P_o$ through the wiring $Al_8$ formed by the aluminum layer. The collector $C_3$ of pull-down transistor $Q_3$ is connected to the emitter $E_2$ of emitter follower transistor $Q_2$, emitter $E_9$ of bipolar transistor $Q_9$ and the resistance $R_4$ formed by the polysilicon layer $P_o$ through the wiring $Al_9$ formed by the aluminum layer and this wiring $Al_9$ of aluminum layer is used for outputting the digital output signal $V_{ol}$.

The emitter $E_2$ of emitter follower transistor $Q_2$ is connected, as described above, to the collector $C_3$ of pull-down transistor $Q_3$, resistance $R_4$, and emitter $E_9$ of bipolar transistor $Q_9$. The base $B_2$ of emitter follower transistor $Q_2$ is connected, as described, to the common collector $CC_1$ and collector load resistance $R_2$ of the bipolar transistors $Q_{lA}$, $Q_{lB}$ through the wiring $Al_6$ formed by the aluminum. The collector of emitter follower transistor $Q_2$ is coupled in common with the collectors $CC_2$ of bipolar transistors $Q_4$, $Q_9$ and this common collector is connected to the power source voltage $V_{cc2}$ through the wiring $Al_{10}$ formed by the aluminum layer.

Regarding the emitter $E_4$ and collector of the bipolar transistor $Q_4$, the emitter $E_4$ is coupled to the base $B_3$ of pull-down transistor $Q_3$, differential capacitance $C_{al}$ and resistance $R_1$ through the wiring $Al_7$ formed by the aluminum layer, while the collector is formed as the common collector $CC_2$ together with the collectors of emitter follower transistor $Q_2$ and bipolar transistor $Q_4$. The base $B_4$ of bipolar transistor $Q_4$ is connected to the wiring $Al_{11}$ formed by the aluminum layer and the base control voltage $Vb_1$ is supplied through this wiring.

The emitter $E_9$ and collector of the bipolar transistor $Q_9$ are connected, as described above, to the resistance $R_4$, emitter $E_2$ of emitter follower transistor $Q_2$ and collector $C_3$ of pull-down transistor $Q_3$ through the wiring $Al_9$ formed by the aluminum layer, while the collector is formed as the common collector $CC_2$ together with the collector of bipolar transistor $Q_9$ and collector of emitter follower transistor $Q_4$. The base $B_9$ of bipolar transistor $Q_9$ is coupled to the wiring $Al_{12}$ formed by the aluminum layer and the base control voltage $V_{b2}$ is supplied through this wiring.

As described above, the overshoot of digital output signal $V_{ol}$ toward the negative voltage is prevented and low level $V_L$ of digital output signal $V_{ol}$ can be ensured. Moreover, since the collectors of bipolar transistors $Q_{1A}$ and $Q_{1B}$ forming the phase split circuit 1 or the collectors of bipolar transistor $Q_4$ of bias circuit 4 and the bipolar transistor $Q_9$ of clamp circuit 8 are formed on the same region of a semiconductor substrate, thereby realizing a superminiaturized cell.

FIG. 16 indicates a second embodiment for realizing the first principle diagram of the logic circuit $LOG_1$ shown in FIG. 1 to which the present invention is applied.

FIG. 16 will be explained focusing on difference from the embodiment of FIG. 1. The logic circuit $LOG_1$ of this embodiment also is provided with a bias circuit 9.

The bias circuit 9 is formed by the resistance $R_9$ coupled between the emitter of emitter follower transistor $Q_2$ and the differential capacitance $C_{al}$. This bias circuit 9 increases a charging current for driving the pull-down transistor $Q_3$ with the differential capacitance $C_{al}$ by DC-feedback of the digital Output signal $V_{ol}$ to the base of pull-down transistor $Q_3$ through the resistance $R_9$ when the digital output signal is in the high level $V_H$.

Thereby, good falling characteristic can be obtained even when the load capacitance $CL_1$ changes.

FIG. 17 indicates an embodiment of the wired logic 10 formed by wiring a couple of logic circuits $LOG_1$ shown in FIG. 16 as the cells of large capacity gate array integrated circuit.

In FIG. 17, since a pair of logic circuits $LOG_1$ are shown, the one is designated as $LOG_{1E}$ and the other as $LOG_{1F}$. Moreover, the digital input signal $V_{il}$ is also indicated as $V_{il}$ and $V_{il'}$, respectively for the logic circuits $LOG_{1E}$ and $LOG_{1F}$. As is already described, a pair of logic circuits $LOG_{1E}$, $LOG_{1F}$ can easily form the wired logic 10 since a current flowing from the load side when the Output is low level $V_L$ is suppressed to a lower level.

In FIG. 17, the digital output signal $V_{o5} = \overline{(V_{il} + V_{il'})}$ for the digital input signals $V_{il}$, $V_{il'}$, can be realized by forming the wired logic 10. In the same figure, the wired logic 10 is formed by non-connection of a part of the cell formed by the logic circuit $LOG_{1F}$ namely non-application of the bias circuit 9, resistance $R_1$ and pull-down transistor $Q_3$ of the logic circuit $LOG_{1D}$. Accordingly, a current flowing from the load side is suppressed smaller than that in the embodiment of FIG. 11 and moreover electromigration of wirings $l_3$ and $l_4$ is not easily generated and superminiaturization can then be realized.

Figure 18:
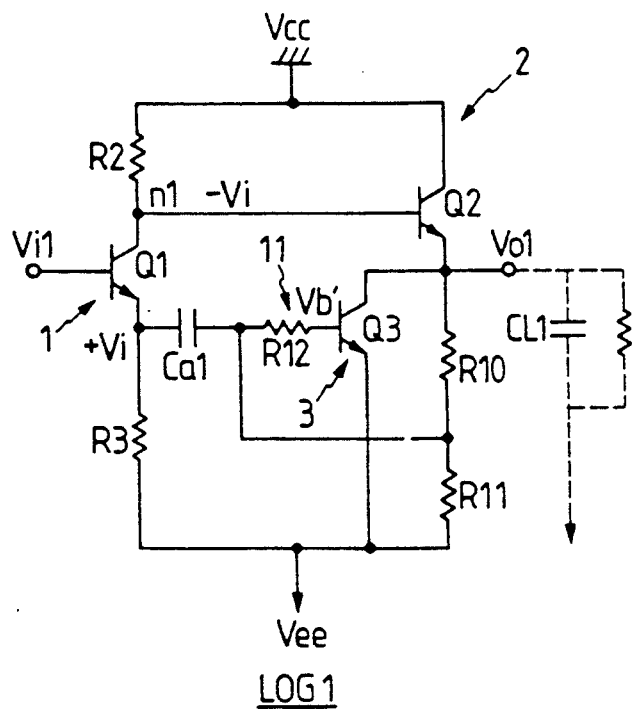
FIG. 18 is a third circuit diagram for realizing the first principle diagram of the first logic circuit shown in FIG. 1.

FIG. 18 indicates a third embodiment for realizing the first principle diagram of the logic circuit $LOG_1$ shown in FIG. 1 by the present invention.

Explanation will be made focusing on difference from FIG. 1. The logic circuit $LOG_1$ is formed as a load means Of the emitter follower transistor $Q_2$ forming the output emitter follower circuit and moreover with addition of Serial resistances $R_{10}$ and $R_{11}$. A resistance $R_{12}$ is provided, although, not particularly limited, between the node connected in common of the resistances $R_{10}$ and $R_{11}$ and the base of pull-down transistor $Q_3$. The base of pull-down transistor $Q_3$ is coupled with capacitance to the emitter of the bipolar transistor $Q_1$ through the differential capacitance $C_{al}$. Here, the resistances $R_{10}$ and $R_{11}$ are designed to have comparatively large resistance values and the resistance $R_{12}$ is designed to have a predetermined resistance value which makes sufficiently large an input impedance of the pull-down transistor $Q_3$. Thereby, the resistance $R_{12}$ forms a bias circuit 11, together with the resistances $R_{10}$ and $R_{11}$. which gives the predetermined bias voltage $V_b$, to the base of pull-down transistor $Q_3$ and also forms a differential circuit, together with the differential capacitance $C_{al}$, which transmits level change of digital input signal $V_{il}$ to the base of pull-down transistor $Q_3$.

When the digital input signal $V_{il}$ is fixed to the predetermined low level $V_L$ and the digital output Signal $V_{ol}$ to the predetermined high level $V_H$, the bias voltage $V_b$, predetermined by the resistance ratio of resistances $R_{10}$ and $R_{11}$ is applied to the base of pull-down transistor $Q_3$. This bias voltage $V_b$, is set to the predetermined voltage value which makes the pull-down transistor $Q_3$ to weak ON condition as in the case of the embodiment shown in FIG. 5. Thereby, the pull-down transistor $Q_3$ is set to the very weak ON condition without giving influence on the digital output signal $V_{ol}$.

When the digital input signal $V_{il}$ changes to the high level $V_H$ from the low level $V_L$, the base voltage of pull-down transistor $Q_3$ becomes temporarily high since level change of digital input signal $V_{il}$ is transmitted through the differential circuit formed by the differential capacitance $C_{al}$ and resistance $R_{12}$. Therefore, the pull-down transistor $Q_3$ becomes perfect ON condition temporarily and the digital output signal $V_{ol}$ is quickly changed to the low level $V_L$ from the high level $V_H$.

While the digital input signal $V_{il}$ is fixed to the predetermined high level $V_H$ and the digital Output signal $V_{ol}$ to the predetermined low level $V_L$, the base voltage of pull-down transistor $Q_3$ is set to the low level and the pull-down transistor $Q_3$ is set to almost the cut-off condition. Under this condition, when the digital input signal $V_{il}$ changes to the low level $V_L$ from the high level $V_H$, the base voltage of pull-down transistor $Q_3$ is temporarily lowered because level change of digital input signal $V_{il}$ is transmitted through the differential circuit. Thereby, the transistor $Q_3$ is further set to deep cut-off condition and the digital output signal $V_{ol}$ is quickly changed to the high level from the low level $V_L$ through the emitter follower transistor $Q_2$.

As described above, the base of pull-down transistor $Q_3$ in the logic circuit $LOG_1$ of this embodiment is capacitively coupled to the emitter of bipolar transistor $Q_1$ through the differential capacitance $C_{al}$ and also coupled to the node connected in common of the resistances $R_{10}$ and $R_{11}$ through the resistance $R_{12}$. The resistance $R_{12}$ forms the differential circuit, together with the differential capacitance $C_{al}$, which sends level change of digital input signal $V_{il}$ to the base of pull-down transistor $Q_3$ and also forms a bias circuit 11, together with the resistances $R_{10}$ and $R_{11}$, which gives the predetermined bias voltage $V_b$, to the base of pull-down transistor $Q_3$. The logic circuit $LOG_1$ of this embodiment enhances the driving sensitivity of the pull-down transistor $Q_3$ by supplying the bias voltage $V_b$, to the base of pull-down transistor $Q_3$. The malfunction due to the change of power source voltage $V_{ee}$ of pull-down transistor $Q_3$ shown in FIG. 14 can be reduced by supplying the bias voltage $V_b$, with the digital Output signal $V_{ol}$.

Figure 19:
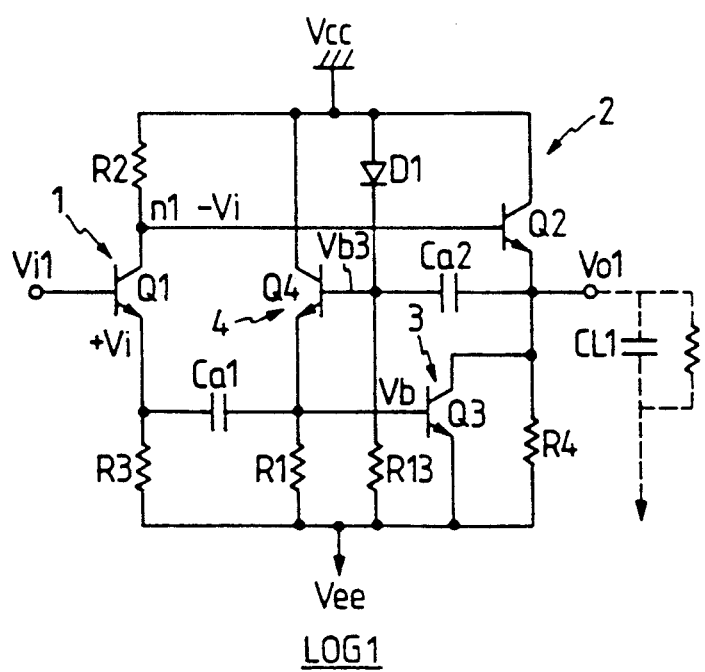
FIG. 19 is a circuit diagram providing a constant voltage generating circuit in the first logic circuit shown in FIG. 5.

FIG. 19 indicates an embodiment in which a constant voltage circuit is added to the logic circuit $LOG_1$ shown in FIG. 5.

Emphasis is placed on difference from FIG. 5 for the following explanation. In the same figure, a diode $D_1$ is provided between the base of bipolar transistor $Q_4$ and power source voltage $V_{cc}$. Moreover, a resistance $R_{13}$ is provided, although not particularly limited, between the base of bipolar transistor $Q_4$ and the power source voltage $V_{ee}$, while a capacitance $C_{a2}$ between the base of bipolar transistor $Q_4$ and the emitter of emitter follower transistor $Q_2$, namely the output terminal of the logic circuit $LOG_1$. Thereby, the resistance $R_{13}$ forms, together with the diode $D_1$, a constant voltage generating circuit which gives the predetermined base control voltage $V_{b3}$ to the base of bipolar transistor $Q_4$ and also forms, together with the capacitance $C_{a2}$, a differential circuit which sends level change at the output terminal to the base of bipolar transistor $Q_4$. Here, the resistance $R_{13}$ is designed to have a comparatively large resistance value and does not prevent power saving of the logic circuit $LOG_1$.

When the level of digital output signal $V_{il}$ is fixed to the high level $V_H$ or low level $V_L$, a predetermined base control voltage $V_{b3}$ which is determined by the forward voltage $V_{DF1}$ of diode $D_1$ is supplied to the base of bipolar transistor $Q_4$. This base control voltage $V_{b3}$ is set, as in the case of the base control voltage $V_{b1}$ in the embodiment shown in FIG. 5, to the predetermined voltage value which applies a bias voltage $V_b$ to the base of pull-down transistor $Q_3$ so that it is set to a very weak ON condition. From these facts, the pull-down transistor $Q_3$ functions similar to the embodiment of FIG. 5 and thereby the logic circuit $LOG_1$ of this embodiment realizes low power consumption without giving influence on the high speed operation characteristic.

Here a differential circuit consisting of the capacitance $C_{a2}$ and resistance $R_{13}$ is provided, as described above, between the output terminal of logic circuit $LOG_1$ of this embodiment and the base of bipolar transistor $Q_4$. This differential circuit sets the digital Output signal $V_{ol}$ to the low level $V_L$, causes discharging of differential capacitance $C_{al}$ and improves response characteristic for the pulsewise input signal.

As described, in the logic circuit $LOG_1$ of this embodiment, the diode $D_1$ is provided between the base of bipolar, transistor $Q_4$ forming the bias circuit 4 and the power source voltage $V_{cc}$ and a capacitor $C_{a2}$ is provided between the base thereof and the output terminal of the logic circuit $LOG_1$. Moreover, the resistance $R_{13}$ which forms a constant voltage generating circuit together with the diode $D_1$ and forms a differential circuit together with the capacitance $C_{a2}$ is provided between the base of bipolar transistor $Q_4$ and the power source voltage $V_{ee}$.

This resistance $R_{13}$ is designed to have a comparatively large resistance value. Thereby, the logic circuit $LOG_1$ of this embodiment simplifies the constant voltage generating circuit for giving the predetermined base control voltage $V_{b3}$ to the base of bipolar transistor $Q_4$ and further improves response characteristic for the pulsewise input signal by feedback operation to be carried out through the bipolar transistors $Q_4$ and $Q_3$. As described above, since the resistances $R_4$ and $R_{13}$ are designed to have comparatively large resistance value, low power consumption of the logic circuit $LOG_1$ can be realized.

Figure 20:
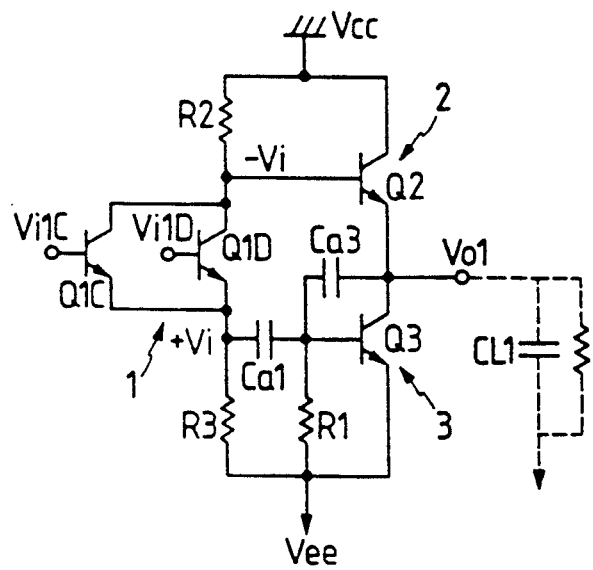
FIG. 20 is a circuit diagram indicating the second principle diagram of the first logic circuit to which the present invention is applied.

FIG. 20 is the second principle diagram of the logic circuit to which the present invention is applied.

In FIG. 20, this circuit is basically the same as the embodiment of FIG. 1 and the phase split circuit 1, emitter follower output circuit 2 and active pull-down circuit 3, etc. correspond to those in the embodiment of FIG. 1.

Following explanation will be made placing emphasis on difference from FIG. 1. In the same figure, the phase split circuit 1 is formed by the bipolar transistors $Q_{iC}$ and $Q_{iD}$ which receive the digital input signals $V_{ilC}$ and $V_{ilD}$. Moreover, even in case the logic of digital input signals $V_{ilC}$, $V_{ilD}$ changes to the high level $V_H$ and low level $V_L$ with a little time difference, the digital output signal $V_{ol}$ quickly responds to such change. Therefore, a capacitance $C_{a3}$ is provided for urging discharge operation of differential capacitance $C_{al}$ for conductively driving the emitter load transistor $Q_3$.

Figure 21:
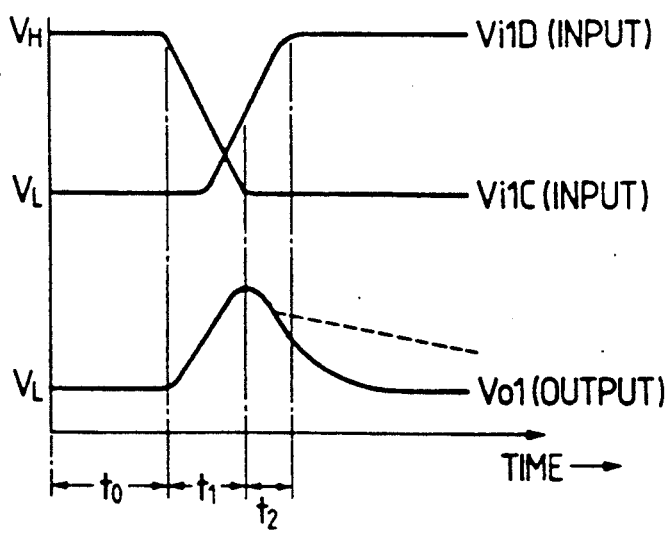
FIG. 21 illustrates waveforms indicating operation example of the first logic circuit shown in FIG. 20.

FIG. 21 illustrates the waveforms for explaining the operations of logic circuit $LOG_1$ shown in FIG. 20.

In the operation example of the same figure, since the logic of a pair of digital input signals $V_{ilC}$, and $V_{ilD}$ changes to the high level $V_H$ only with a little time difference, the digital output signal $V_{ol}$ becomes high level $V_H$ only within a very short period.

In FIG. 20 and FIG. 21, when, in the period to wherein the digital input signal $V_{ilc}$ and $V_{ild}$ are respectively high level $V_H$ and low level $V_L$, the differential capacitance $C_{al}$ is charged to the saturated condition, viewed from the side of phase split circuit 1, because the common emitter voltage of bipolar transistors $Q_{iC}$, $Q_{iD}$, namely the non-inverted output $+V_i$ of phase split circuit 1 is high level. Moreover, the capacitance $C_{a3}$ is in the non-charged condition viewed from the output side because the emitter voltage of emitter follower transistor $Q_2$, namely the digital output signal $V_{ol}$ is low level.

Next, in the period $t_l$ wherein the digital input signal $V_{ilC}$ changes to the low level $V_L$ from the high level $V_H$ and the digital input signals $V_{ilC}$ and $V_{ilD}$ become low level $V_L$, the non-inverted output $+V_i$ of the phase split circuit 1 falls to the low level from the high level and thereby, the differential capacitance $C_{al}$ in the charging condition starts in turn the discharge operation. Simultaneously, since the emitter voltage of emitter follower transistor $Q_2$, namely the digital output signal $V_{ol}$ rises to the high level $V_H$ from the low level $V_L$, the capacitance $C_{a3}$ in the non-charging condition starts in turn the charging operation. That is, discharge operation of the differential capacitance $C_{al}$ is accelerated by the charging operation of capacitance $C_{a3}$. As a result, the differential capacitance $C_{al}$ charged is sufficiently discharged within a very short period from the timing where the non-inverted output $+V_i$ of the phase split circuit 1 falls to the low level from the high level.

Thereby, in the period $t_2$ where the digital input signal $V_{ilD}$ changes to the high level $V_H$ from the low level $V_L$ and the non-inverted output $+V_i$ of phase split circuit 1 rises to the high level from the low level, the differential capacitance $C_{al}$ allows the charging current to flow until sufficiently driving the pull-down transistor $Q_3$. Accordingly, the digital output signal $V_{ol}$ can immediately be lowered to the low level from the high level.

Here, if the capacitance $C_{a3}$ is not provided, since the period $t_1$ in which the logical OR of the digital input signals $V_{ilC}$ and $V_{ilD}$ becomes the low level is very short period, the differential capacitance $C_{al}$ cannot sufficiently discharge the electric charge charged when the non-inverted output $+V_i$ is high level. Therefore, in the period in which the non-inverted output $+V_i$ changes to the high level from the low level, namely in the period $t_2$ in which the digital output signal $V_{ol}$ changes to the low level from the high level, the differential capacitance $C_{al}$ can no longer supply the sufficient charging current to the base of pull-down transistor $Q_3$. As a result, as indicated by a dotted line in FIG. 21, level shift to the low level of the digital output signal $V_{ol}$ is much delayed.

As described above, even when the digital input signals $V_{ilC}$ and $V_{ilD}$ of the logic circuit $LOG_1$ of the embodiment shown in FIG. 20 change within a very short period, such level change can be sent certainly to the digital output signal $V_{ol}$.

Figure 22:
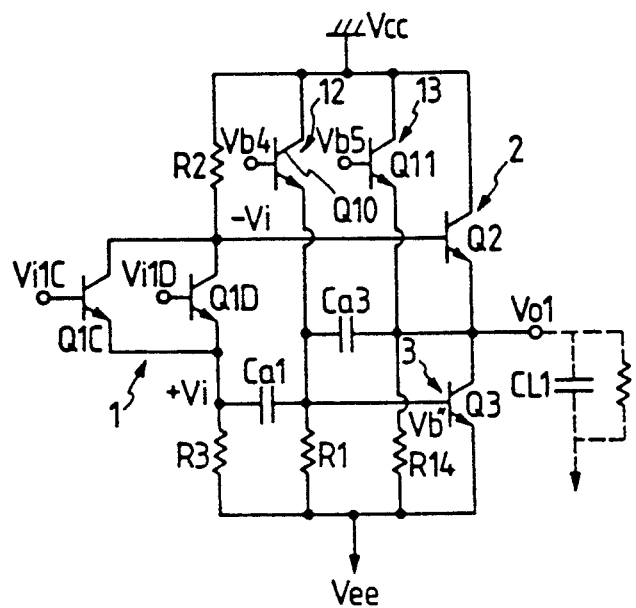
FIG. 22 is a circuit diagram for realizing the second principle diagram of the first logic circuit shown in FIG. 20.

FIG. 22 indicates an embodiment for realizing the logic circuit $LOG_1$ shown in FIG. 20 by the present invention.

Focusing on the difference from FIG. 20, in the logic circuit $LOG_1$ of the embodiment shown in the same figure, a clamp circuit 13 which rejects overshoot of digital output signal $V_{ol}$ in the negative voltage side like the clamp circuit 8 shown in FIG. 14 and a resistance $R_{14}$ for assuring the level of digital output signal $V_{01}$ like the high resistance $R_4$ shown in FIG. 5 are provided, together with the bias circuit 12 which biases the pull-down transistor $Q_3$ in the steady state to the condition immediately before the conductive condition like the bias circuit shown in FIG. 5. Like the circuit of FIG. 5, the bias circuit 12 is configurated by the bipolar transistor $Q_{10}$ to which the predetermined base control voltage $V_{b4}$ supplied from the external or internal circuit of the cell formed by the logic circuit $LOG_1$ and the predetermined bias voltage $V_{b'}$, is supplied to the base of pull-down transistor $Q_3$ by applying the predetermined bias current to the resistance $R_1$ connected in parallel to the base of pull-down transistor $Q_3$. Like the bias voltage $V_b$ shown in FIG. 5 and FIG. 6, the predetermined bias voltage $V_{b'}$, is a voltage value for setting the pull-down transistor $Q_3$ to the very weak ON condition, namely a voltage value which results in the collector current $I_{c3}$ of the pull-down transistor of about 10–100 μA.

The clamp circuit 13 is formed by the bipolar transistor $Q_{11}$ to which the predetermined base control voltage $V_{b5}$ is applied like the circuit shown in FIG. 14 and the voltage of digital output signal $V_{ol}$ is boosted exceeding the predetermined low level $V_L$ by the emitter follower operation of the bipolar transistor $Q_{11}$.

Figure 23:
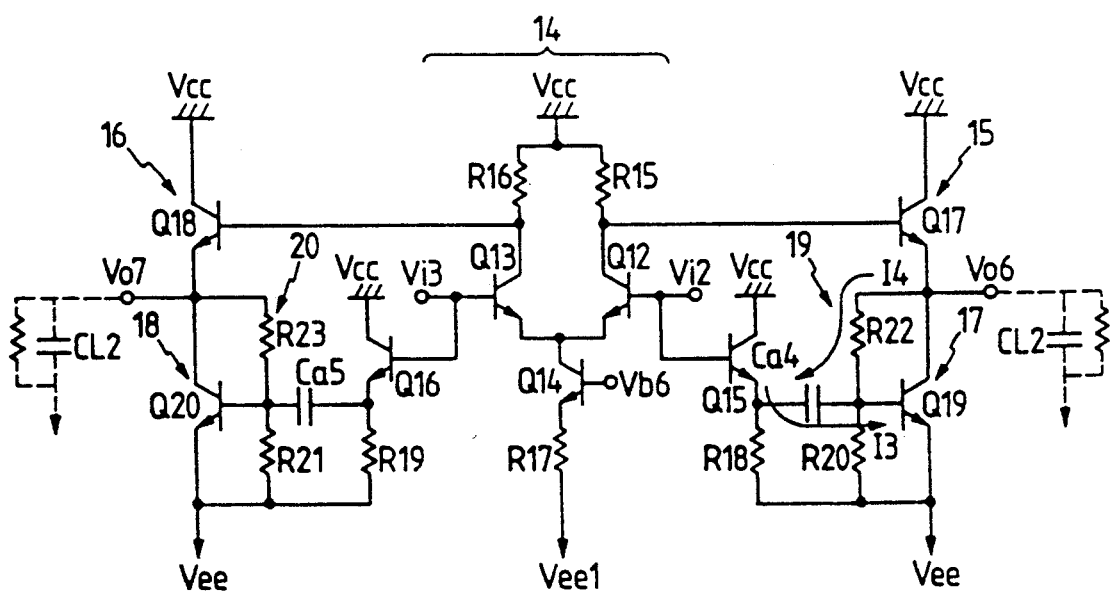
FIG. 23 is a circuit diagram indicating the second logic circuit to which the present invention is applied.

FIG. 23 indicates an embodiment of the second logic circuit to which the present invention is applied.

In FIG. 23, the logic circuit LOG$_3$ is formed by the phase inverting circuit 14 which receives the complementary digital input signals V$_{i2}$, V$_{i3}$ and outputs the phase-inverted digital input signals V$_{i2}$, V$_{i3}$, emitter follower output circuits 15, 16 which are driven by outputs of the phase inverting circuit 14, active pull-down circuits 17, 18, differential capacitances C$_{a4}$, C$_{a5}$ for differentiating rising edges of the digital input signals V$_{i2}$, V$_{i3}$ supplied through bipolar transistors Q$_{15}$, Q$_{16}$, and bias circuits 19, 20.

The phase inverting circuit 14 is formed by the bipolar transistors Q$_{12}$–Q$_{14}$ and resistances R$_{15}$–R$_{17}$, the predetermined base control voltage V$_{b6}$ (for example, 1.85 V) is supplied to the base of bipolar transistor Q$_{14}$ and thereby it forms a constant current circuit together with the resistance R$_{17}$. As described the phase inverting circuit 14 inverts the phase of the complementary digital input signals V$_{i2}$, V$_{i3}$ and outputs such signals to the emitter follower output circuits 15, 16.

The emitter follower output circuits 15, 16 are respectively formed by the emitter follower transistors Q$_{17}$, Q$_{18}$. The emitters of emitter follower transistors Q$_{17}$, Q$_{18}$ are respectively connected to the power source voltage V$_{ee}$ through the pull-down transistors Q$_{19}$, Q$_{20}$ described later and also connected to the load capacitance CL$_2$ generated equivalently by the distributed capacitance of the output wirings.

The active pull-down circuits 17, 18 are respectively formed by the pull-down transistors Q$_{19}$, Q$_{20}$. The pull-down transistors Q$_{19}$, Q$_{20}$ are emitter loads of the emitter output circuits 15, 16 and switchingly connect the output of emitter follower transistors Q$_{17}$, Q$_{18}$, namely the digital output signals V$_{o6}$, V$_{o7}$ of the logic circuit LOG$_3$ respectively to the power source voltage V$_{ee}$.

The differential capacitances C$_{a4}$, C$_{a5}$ differentiate the in-phase signals of the digital input signals V$_{i2}$, V$_{i3}$ supplied through the bipolar transistors Q$_{15}$, Q$_{16}$. when the respective digital input signals V$_{i2}$, V$_{i3}$ rise to the high level from the low level and conductively drive the pull-down transistors Q$_{19}$, Q$_{20}$ temporarily.

The bias circuits 19, 20 comprise the resistances R$_{22}$, R$_{23}$ which feed the voltages of digital output signals V$_{o6}$, V$_{o7}$ back to the bases of pull-down transistors Q$_{19}$, Q$_{20}$ and the resistances R$_{20}$, R$_{21}$ which pull down the bases of pull-down transistors Q$_{19}$, Q$_{20}$ to the side of emitter.

The bipolar transistors Q$_{15}$, Q$_{16}$ form the emitter follower to the respective digital input signals V$_{i2}$, V$_{i3}$, buffer-amplify the digital input signals V$_{i2}$, V$_{i3}$ in the in-phase condition and then sends such signals to the differential capacitances C$_{a4}$, C$_{a5}$.

As described previously, the power source voltages V$_{ee}$, V$_{eel}$ are negative power source voltages and set, for example, to −2 V, −3 V, respectively. In addition, the power source voltage V$_{cc}$ is the ground potential as described previously.

Operations of logic circuit LOG$_3$ thus configurated as described above will be explained hereunder.

In FIG. 23, when the digital input signal V$_{i2}$ is low level, the base input of the emitter follower transistor Q$_{17}$ of the emitter follower output circuit 15 becomes high level. Thereby, the emitter follower transistor Q$_{17}$ is conductively driven and the digital output signal V$_{o6}$ becomes high level. In this timing, the pull-down transistor Q$_{19}$ keeps the non-conductive condition.

Here, when the digital input signal V$_{i2}$ changes to the high level from the low level, the base input of the emitter follower transistor Q$_{17}$ becomes the low level from the high level and the emitter follower transistor Q$_{17}$ is changed to the non-conductive condition from the conductive condition. In this case, when the digital input signal V$_{i2}$ rises to the high level from the low level, a charging current I$_3$ of the differential capacitance C$_{a4}$ flows into the pull-down transistor Q$_{19}$.

Accordingly, the pull-down transistor Q$_{19}$ becomes conductive temporarily while the emitter follower transistor Q$_{17}$ changes to the conductive condition from the non-conductive condition, forcing the charges of load capacitance CL$_2$ to quickly discharge. Thereby, the digital output signal V$_{o6}$ immediately falls to the low level from the high level after the digital input signal V$_{i2}$ changes to the high level from the low level.

In the same way, the digital output signal V$_{o7}$ also falls immediately to the low level from the high level after the digital input signal V$_{i3}$ changes to the high level from the low level.

As described previously, when the digital output signals V$_{o6}$, V$_{o7}$ fall to the low level from the high level, the pull-down transistors Q$_{19}$, Q$_{20}$ are temporarily set to the conductive condition with the differential output. Thereby, the load capacitance CL$_2$ is forced to discharge and the digital output signals V$_{o6}$, V$_{o7}$ quickly fall. In other cases, the pull-down transistors Q$_{19}$, Q$_{20}$ are kept at the non-conductive condition and a current steadily consumed is kept small.

Further, in the logic circuit LOG$_3$, the base bias condition of pull-down transistors Q$_{19}$, Q$_{20}$ changes depending on the load condition of the digital output signals V$_{o6}$, V$_{o7}$. Namely, when a load capacitance CL$_2$ is still charged with remaining charges, the conductive driving level of the pull-down transistors Q$_{19}$, Q$_{20}$ is enhanced because the high voltage by the remaining charges increases the base bias level of the pull-down transistors Q$_{19}$, Q$_{20}$. Thereby, the pull-down effect, namely the effect of lowering the digital output signals V$_{o6}$, V$_{o7}$ can also be enhanced.

In addition, when the digital output signals V$_{o6}$, V$_{o7}$ are high level, a charging current I$_4$ is supplied to charge the differential capacitances C$_{a4}$, C$_{a5}$ through the resistances R$_{23}$, R$_{24}$ from the side of digital output signals V$_{o6}$, V$_{o7}$. Therefore, the charging current for driving the pull-down transistors Q$_{19}$, Q$_{20}$ from the differential capacitances Ca$_4$, Ca$_5$ also increases by DC feedback of the voltage of digital output signals V$_{o6}$, V$_{o7}$ to the base to pull-down transistors Q$_{19}$, Q$_{20}$.

Thereby, good falling characteristic of the logic circuit LOG$_3$ comprising the emitter follower output circuits 15, 16 can be obtained without relation to change of load capacitance CL$_2$.

Figure 24:
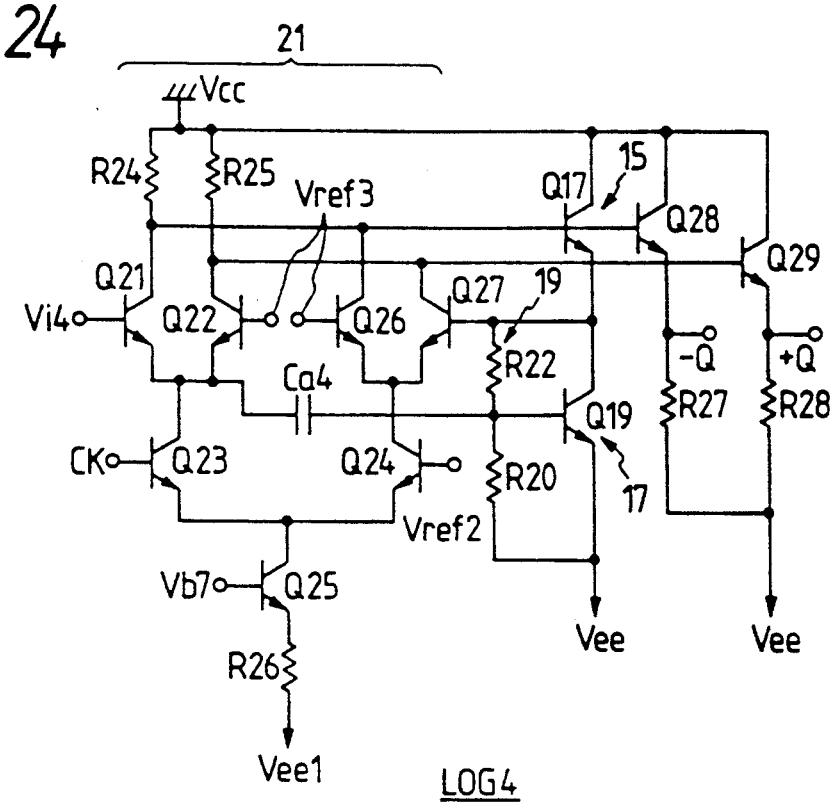
FIG. 24 is a circuit diagram indicating the third logic circuit to which the present invention is applied.

FIG. 24 shows an embodiment indicating a third logic circuit to which the present invention is applied.

In FIG. 24, the emitter follower output circuit 15, active pull-down circuit 17, bias circuit 19 and differential capacitance C$_{a4}$ correspond to those of embodiment shown in FIG. 23 and operate in the same way.

Moreover in FIG. 24, the logic circuit LOG$_4$ is formed by the D latch circuit 21 which is configurated using the clocked gate by the 2-stage cascade differential circuit consisting of the bipolar transistors Q$_{21}$–Q$_{25}$ and resistances R$_{24}$–R$_{26}$ and emitter follower output circuit formed by the bipolar transistors Q$_{28}$, Q$_{29}$ which provide outputs of D latch circuit 14 as the latch outputs Q, $\overline{Q}$, and the resistances R$_{27}$, R$_{28}$.

The D latch circuit 21 executes the D latch operations by the internal feedback of outputs of clocked gate through the emitter follower by the emitter follower transistor $Q_{17}$. The bipolar transistor $Q_{25}$ forms a constant current source, together with the resistance $R_{26}$, by receiving the predetermined base control voltage $V_{b7}$ (for example, $-1.85$ V). The digital input signal $V_{i4}$ is data input; CK is clock input; $+Q, -Q$ are latch outputs; $V_{ref2}$, $V_{ref3}$ are reference voltages and $V_{eel}$, $V_{ee}$ are negative power source voltages.

Here, the emitter of emitter follower transistor $Q_{17}$ forming the emitter follower output circuit 15 within the D latch circuit is connected With the pull-down transistor $Q_{19}$. In addition, the base of pull-down transistor $Q_{19}$ is self-biased, as in the case Of the embodiment of FIG. 23, with the resistance $R_{22}$ and receives the charging current of the differential capacitance $C_{a4}$ from the side of D latch circuit 21.

Thereby, the D latch circuit 21 of the logic circuit LOG$_4$ described above is capable of executing the high speed data latch operation by improvement of falling characteristic of the emitter follower output circuit 15 provided in the feedback path in such D latch circuit 21. Moreover, since the bipolar transistor $Q_{21}$ and pull-down transistor $Q_{19}$ are resistive to the $\alpha$-ray like the bipolar transistor $Q_1$ and pull-down transistor $Q_3$ shown in FIG. 1, the D latch circuit 21 executes highly reliable holding operation.

Figure 25:
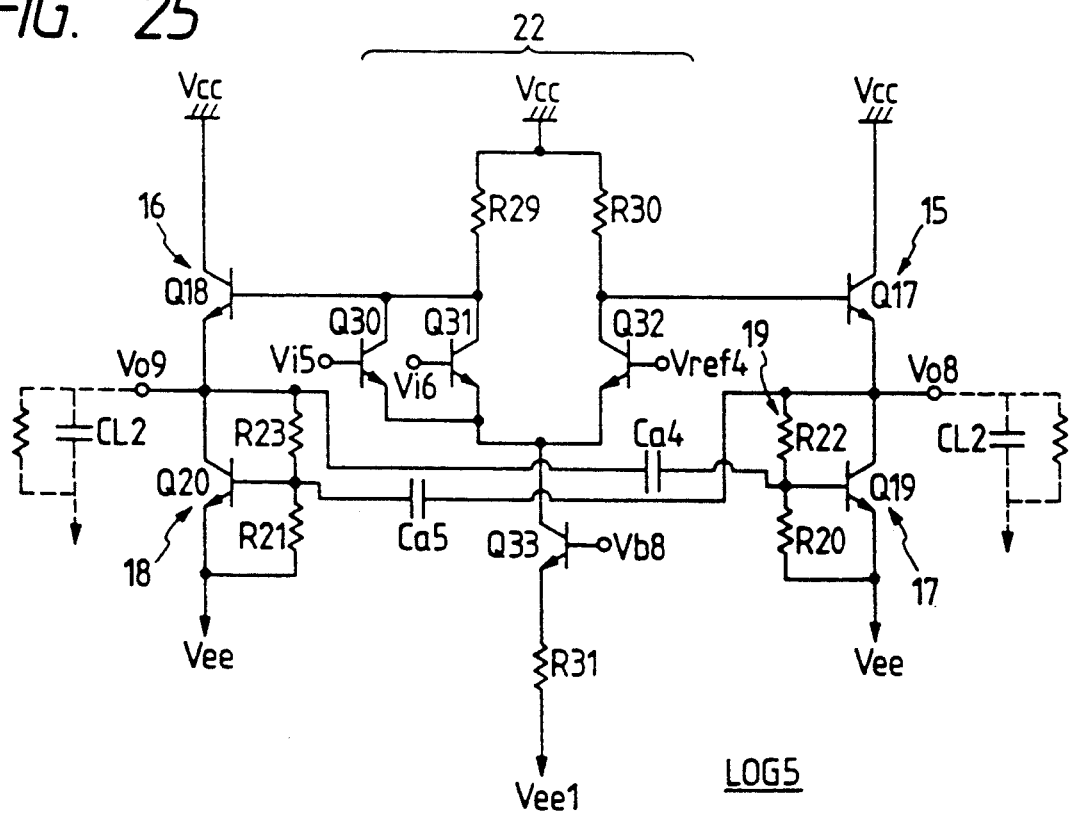
FIG. 25 is a circuit diagram indicating a fourth logic circuit to which the present invention is applied.

FIG. 25 shows an embodiment of the fourth logic circuit to which the present invention is applied.

In FIG. 25, the emitter follower output circuits 15, 16, active pull-down circuits 17, 18, bias circuits 19, 20, differential capacitances $C_{a4}$, $C_{a5}$ respectively correspond to those of embodiment shown in FIG. 23 and operate in the same way.

Referring to FIG. 25, the logic circuit LOG$_4$ is formed by a current switching circuit 22 consisting of the bipolar transistors $Q_{30}$–$Q_{33}$ and resistances $R_{29}$–$R_{31}$, emitter follower output circuits 15, 16 respectively providing output of the current switching circuit, active pull-down circuits 17, 18, bias circuits 19, 20 and differential capacitances $C_{a4}$, $C_{a5}$.

The current switching circuit 22 provides an output respectively to the emitter follower transistors $Q_{17}$, $Q_{18}$ in accordance with the digital input signals $V_{i5}$, $V_{i6}$ and reference voltages $V_{ref4}$. The bipolar transistor $Q_{33}$ receives the predetermined base control voltage $V_{b8}$ (for example, 1.85 V) and forms a constant current source in combination with the resistance $R_{32}$. As described above, output of current switching circuit 22 is output by the emitter follower of the emitter follower transistors $Q_{17}$, $Q_{18}$ as the digital output signals $V_{o8}$, $V_{o9}$.

Respective digital output signals $V_{o8}$, $V_{o9}$ are connected by switching to the power source voltage $V_{ee}$ in the low level side by the pull-down transistors $Q_{19}$, $Q_{29}$.

On the other hand, the differential capacitance $C_{a4}$ differentiates the rising edge of digital output signal $V_{o9}$ and supplies the charging current to the base of pull-down transistor $Q_{19}$ to temporarily drive the transistor. Meanwhile, the differential capacitance $C_{a5}$ differentiates the rising edge of digital output signal $V_{o10}$ and supplies the charging current to the base of pull-down transistor $Q_{20}$ in order to temporarily drive the transistor.

Moreover, in the pull-down transistors $Q_{19}$, $Q_{20}$, the bias is applied depending on the load capacitance $CL_2$ by the feedback of the voltage of digital output signals $V_{o8}$ $V_{o9}$ to the base through the resistance $R_{22}$, $R_{23}$ and by the pull-down of the base to the emitter side through the resistances $R_{20}$, $R_{21}$, and simultaneously the differential output generated when the differential capacitances $C_{a4}$, $C_{a5}$ are charged respectively to the digital output signals $V_{o8}$, $V_{o9}$, is enhanced because the differential capacitances $C_{a4}$, $C_{a5}$ are charged from the side of digital output signals $V_{o8}$, $V_{o9}$ when the these digital output signals are high level.

Thereby, as in the case of the embodiment of FIG. 23 described above, the rising characteristic of the digital output signals $V_{o8}$, $V_{o9}$ output as the complementary signal can be improved.

Figure 26:
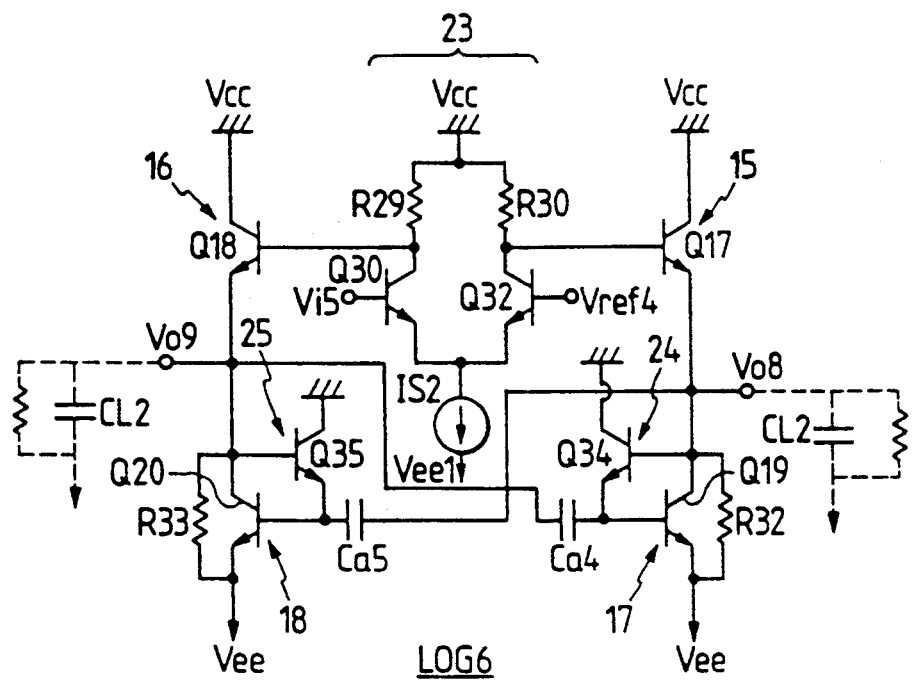
FIG. 26 is a circuit diagram indicating the fifth logic circuit to which the present invention is applied.

FIG. 26 indicates an embodiment of the fifth logic circuit to which the present invention is applied.

In FIG. 26, the logic circuit LOG$_6$ is a modification of the embodiment shown FIG. 25 and has the same basic configuration. Explanation will be made focusing on the difference from FIG. 25. The logic circuit LOG$_6$ includes the complementary signal circuit 23 in which the digital input signals $V_{i5}$, $V_{i6}$ are negative input of $V_{i5}$ and the complementary signal can be formed by high level or low level of the digital input signal $V_{i5}$ and the constant current source which is formed by the bipolar transistor $Q_{31}$ and resistance $R_{31}$ shown in FIG. 25 is designated by IS$_2$. Moreover, the bias circuits 24, 25 are formed by the bipolar transistors $Q_{34}$, $Q_{35}$ in place of the resistances $R_{23}$, $R_{23}$ different from the bias circuits 19, 20 of the embodiment shown in FIG. 25 and the resistances $R_{20}$, $R_{21}$ shown in FIG. 25 are indicated as the resistances $R_{33}$, $R_{32}$.

Figure 28:
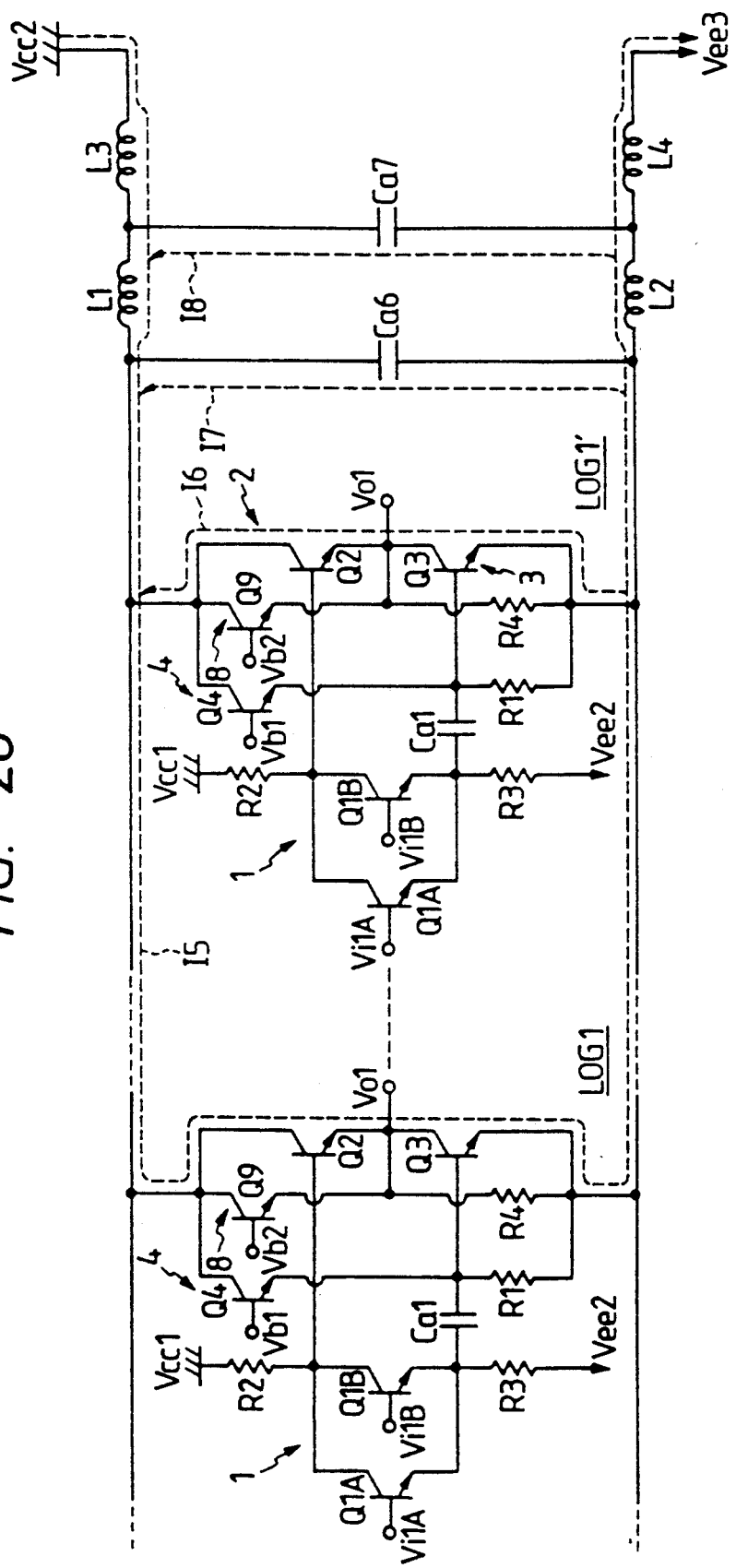
FIG. 28 is a circuit diagram forming a cell of a large capacity gate array integrated circuit shown in FIG. 27 with the first logic circuit.
Figure 29:
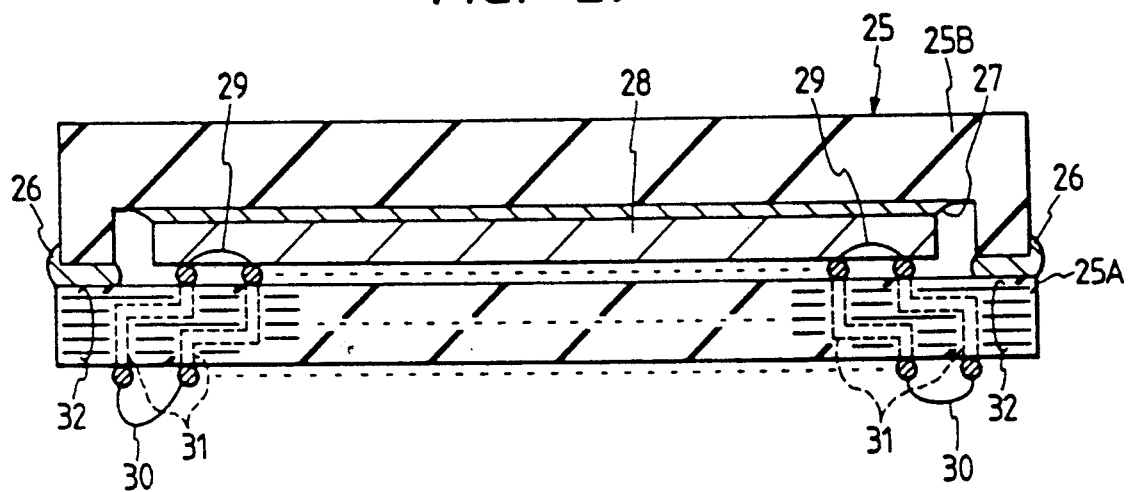
FIG. 29 is a sectional view of a large capacity gate array shown in FIG. 28 sealed by microchip carrier.

FIG. 27 is a schematic plan view of a large capacity gate array integrated circuit to which the present invention is applied. FIG. 28 indicates an embodiment in which the cell of large capacity gate array integrated circuit of FIG. 27 is designated by the logic circuit LOG$_1$ of FIG. 14. FIG. 29 indicates a sectional view of the semiconductor chip forming a large capacity gate array integrated circuit shown in FIG. 27 sealed with the microchip carrier.

Figure 30:
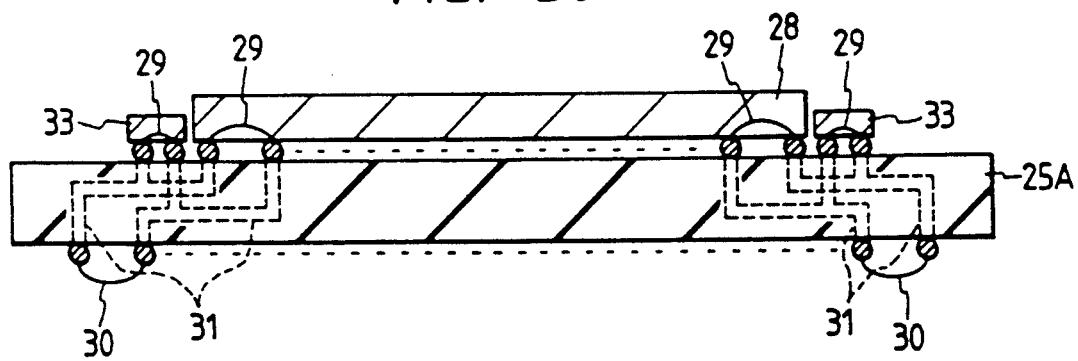
FIG. 30 is a sectional view forming a capacitance chip on the carrier shown in FIG. 29.
Figure 31:
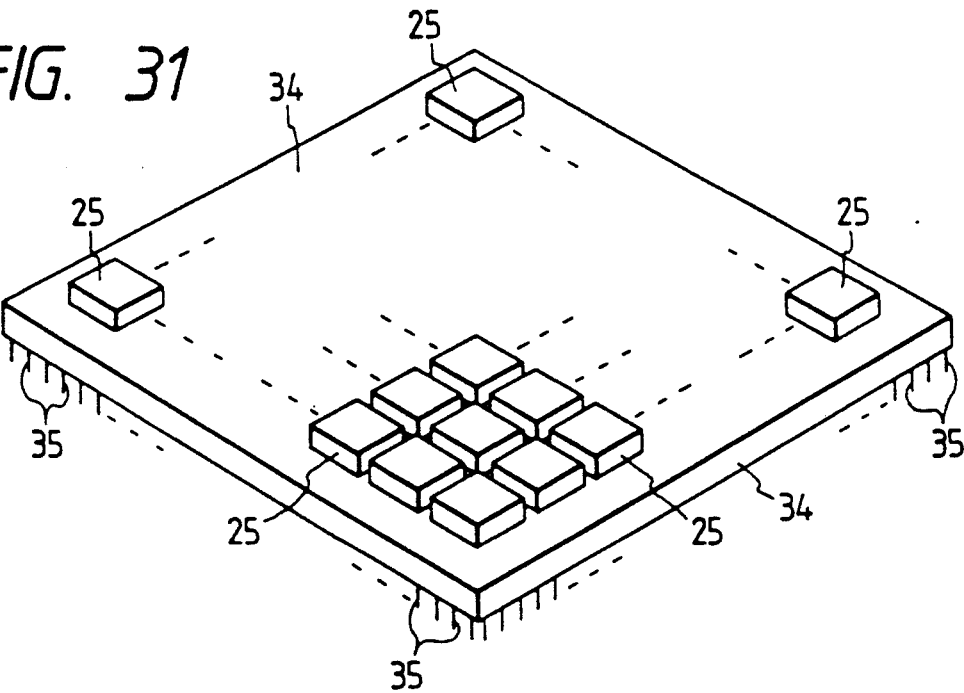
FIG. 31 is diagram indicating mounting of a microchip carrier shown in FIG. 29 on a mounting substrate.
Figure 32:
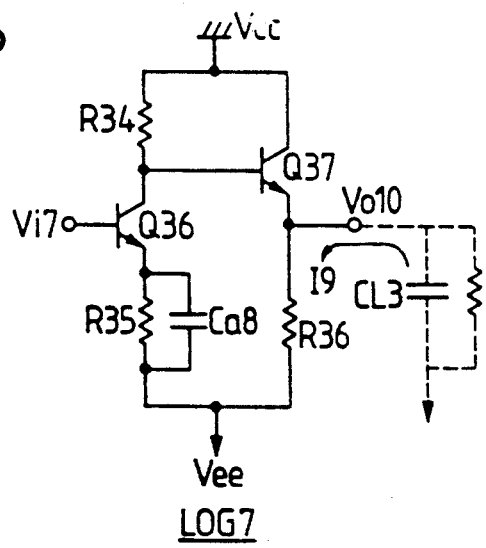
FIG. 32 is a circuit diagram indicating an configuration example of the logic circuit discussed prior to the present invention.
Figure 33:
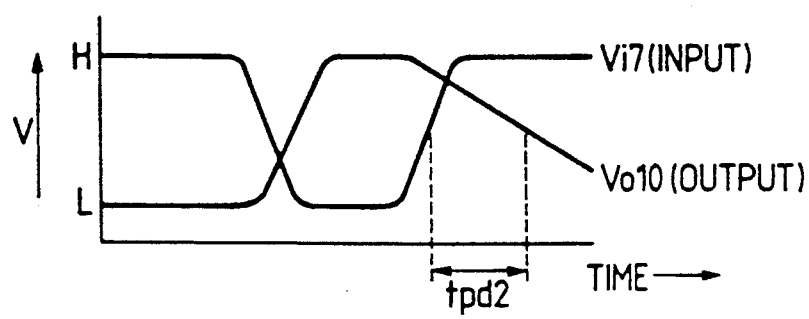
FIG. 33 illustrates waveforms indicating operation example of the logic circuit shown in FIG. 32.

FIG. 30 indicates a sectional view in which a capacitance chip is formed on the carrier shown in FIG. 29. FIG. 31 shows that the microchip carrier shown in FIG. 29 is mounted on the mounting substrate.

In FIG. 27, a large capacity gate array GA allows, although not particularly limited, arrangement of many basic cells at the internal side of input/output buffer region I/O formed by the ECL circuit. Each basic cell forms the logic circuit, for example, the logic circuit LOG$_1$ shown in FIG. 5, FIG. 8, FIG. 10, FIG. 14, FIG. 16, FIG. 18, FIG. 19, FIG. 22, logic circuits LOG$_3$ LOG$_6$ shown in FIG. 23–FIG. 26 or logic circuit LOG$_2$ shown in FIG. 13. The unused cell cell' of the basic cells is the capacitive cells in order to prevent malfunction under the steady state of the pull-down transistor shown in the explanation for FIG. 14. Moreover, in the large capacity gate array integrated circuit GA, the capacitive element CE is formed between the basic cells Cell in order to prevent malfunction described above. Moreover, the large capacity gate array GA is provided with a base control voltage generating circuit 24 in order to form the base control voltage $V_{b1}$ ($V_{b4}$) in accordance with the control voltage $V_c$ supplied from the external terminal. In case the logic circuit of each embodiment is formed with the large capacity gate array integrated circuit GA, many logic circuits can be formed with high density due to the high speed operation characteristic and low power consumption characteristic. In addition, since the wired logic can be formed, the application efficiency of the logic circuit can be remarkably enhanced and a very large scale and high performance semiconductor integrated circuit device can be obtained efficiently with the gate array configuration.

In FIG. 28, the left logic circuit is designated as $LOG_1$, while the right logic circuit as $LOG_{1'}$. Many logic circuits $LOG_1$ are connected between the power source voltage $V_{cc2}$ and $V_{ee3}$. Moreover, the inductances $L_1$, $L_2$ are inductance of CCB bump electrode 29 shown n FIG. 29, while the inductances $L_3$, $L_4$ are inductance of carrie 25A shown in FIG. 29. Moreover, the capacitance $C_{a6}$ is the capacitance in the chip and is equal to the capacitance of the capacitance element CE and unused cell cell' shown in FIG. 27 and the capacitance $C_{a7}$ is the capacitance of carrier 25A shown in FIG. 29, namely the layered capacitance 32 or capacitance chip 33 shown in FIG. 29 and FIG. 30.

In FIG. 28, when the digital output signal $V_{ol}$ of logic $LOG_1$ falls to the low level from the high level, the pull-down transistor $Q_3$ is temporarily driven conductively as described previously. In this case, since the emitter follower transistor $Q_2$ is not yet sufficiently driven non-conductively, a current $I_5$ temporarily flows. The power source voltage $V_{ee3}$ changes according to being flown the current $I_5$ to the inductances $L_1$, $L_2$, $L_3$ and $L_4$ therefore the pull-down transistor $Q_3$ is conductively driven due to change of emitter voltage of such pull-down transistor $Q_3$ at the steady state of the logic circuit connected to the power source voltages $V_{cc2}$ and $V_{ee3}$, for example, the logic circuit $LOG_{1'}$, resulting in possibility of malfunction. However, in this embodiment, many logic circuits $LOG_1$ are connected between the power source voltages $V_{cc2}$ and $V_{ee3}$. The pull-down transistor $Q_3$ under the steady state of the logic circuit $LOG_1$ is in the very weak ON condition and the collector current $I_{c3}$ is about 10-100 $\mu A$ as described previously. Moreover, since the emitters of pull-down transistors $Q_3$ of a plurality of logic circuits $LOG_1$ are connected in common to the power source voltage $V_{ee3}$, a kind of emitter coupled circuit is formed. In addition, a small number of pull-down transistors $Q_3$ are conductively driven simultaneously in the large capacity gate array GA. Therefore, since a part of through current $I_5$ flows onto a loop like the current $I_6$, the through current flowing into the inductances $L_1$, $L_2$, $L_3$ and $L_4$ decreases, suppressing variation of power source voltage $V_{ee3}$. However, since the logic circuit $LOG_1$ is a super high speed circuit, variation of power source voltage $V_{ee3}$ is suppressed and moreover the chip capacitance $C_{a6}$ of the large capacity gate array integrated circuit GA and the capacitance $C_{a7}$ of the carrier 25A shown in FIG. 29 and FIG. 30 are formed in the large capacity gate array integrated circuit GA of this embodiment. A part of the through current Is further flows on the loop like the current $I_6$, $I_7$, $I_8$ and thereby variation of power source voltage $V_{ee3}$ is suppressed.

In FIG. 29, 25 designates microchip carrier; 25A, carrier for mounting chip; 25B, cap; 26, 27, solder; 28, semiconductor chip; 29, CCB (Controlled Collapse Bonding) bump electrode; 30, bump electrode for mounting; 31, wiring. The arrow mark at the end of leader line indicates the entire part of microchip carrier 25.

The CCB bump electrode 29 is connected to the input/output terminal of gate array integrated circuit GA and power source terminals of power source voltages $V_{cc}$ and $V_{ee}$ and is also connected to the bump electrode 30 for mounting through the wiring 31.

The microchip carrier 25 of this embodiment forms a layered capacitance 32 on the chip mounting carrier 25A in order to prevent malfunction under the steady state of the pull-down transistor $Q_3$.

The CCB bump electrode 29 is described in the Japanese Laid-open Patent No. 62-249429 and the microchip carrier 25 is described in the Japanese Patent Application No. 62-146397.

In FIG. 30, the basic configuration is the same as that of microchip carrier 25 shown in FIG. 29. Focusing on difference from the microchip carrier 25 of FIG. 29, this embodiment prevents malfunction of the pull-down transistor $Q_3$ under the steady state by not forming the layered capacitance 32 on the carrier 25A, forming the capacitance chip 33 on the carrier 25A and connecting such chip to the wiring 31 through the CCB bump electrode 29.

In FIG. 31, 34 designates a mounting substrate; 35 is pin. Many microchip carriers 25 are mounted on the substrate 34 as shown in FIG. 31. The mounting bump electrode 30 is connected to the pin 35 by a plurality of wired layers (not illustrated) included in the substrate 31. The substrate 34 is sealed by the cap, although not illustrated.

As described, in the large capacity gate array integrated circuit GA of this embodiment, a plurality of logic circuits $LOG_1$ *are provided between the power source voltages* $V_{cc2}$ and $V_{ee3}$ in order to prevent malfunction of the pull-down transistor $Q_3$ under the steady state due to variation of the power source voltage $V_{ee3}$. In addition, such malfunction can be further prevented by forming capacitance on the chip 28 and carrier 25A. Moreover, such malfunction is prevented more successfully by sealing the package of the large capacity gate array integrated circuit GA by the method in which the microchip carrier 25 is sealed using the CCB bump electrode 29 having smaller inductance than that in the method using the lead wire. Moreover, since the base control voltage $V_{bl}(V_{b4})$ of the bias circuits 4 and 8 and bipolar transistors $Q_4$ and $Q_{10}$ can be controlled by changing the control voltage VC shown in FIG. 27. Accordingly, the falling time of the digital Output signal $V_{ol}$ of the logic circuit $LOG_1$ can be delayed, for testability of the large capacity gate array integrated circuit GA, by controlling the bias voltage $V_b$ ($V_{b'}$) of the pull-down transistor $Q_3$.

As explained in the embodiments above, in case the present invention is applied to the large capacity gate array or high speed logic integrated circuit basically configurated by the NTL circuit or ECL circuit, following effects can be obtained.

(1) The load means can be temporarily short-circuitted at the beginning of the low level output and level of output signal can be changed quickly by providing the pull-down transistor which is capacitively connected to the emitter of the transistor receiving the input signal at its base and temporarily shows a large conductance for the low level output.

(2) With the item (1), following effect can be obtained. Namely, good response characteristic of input pulse to the NTL circuit can be obtained and level change at the rising and falling edges is almost equal. The high load driving capability for the NTL circuit can be realized and the output signal in the range from light to heavy load can be changed quickly by forced removable of capacitance of load means for the low level output with the pull-down transistor. Since the pull-down transistor such as NTL circuit shows high impedance under the steady state, a wired OR circuit which does not easily generate electromigration can be formed. Employment of the NTL circuit having the configuration indicated in the item (1) results in resistivity to the α-ray. With use of the NTL circuit of the configuration described above, the pull-down transistor can be formed without use of a particular element such as PNP transistor and output signal level can be changed quickly. Since the pull-down transistor can be formed on a single semiconductor substrate together with the other circuit elements, high speed level change of the output signal can be realized by the device technology. Since the NTL circuit is a low amplitude circuit, operation rate can further be improved. Low power consumption of the NTL circuit can be attained by making large the resistance value of load means and making small an operation current of the output emitter follower circuit.

(3) Following effects can be obtained from the items (1) and (2). The NTL circuit is a low voltage circuit and low power consumption can also be realized for the NTL circuit. Since the rising and falling times of output signal are almost equal, simplified delay calculation of the NTL circuit can be realized easily and dependence on the input waveform of the circuit operation rate of NTL circuit can be reduced. The load driving capability of the NTL circuit can further be improved by providing the bias circuit to the base of pull-down transistor of the NTL circuit of the configuration described above. The low power consumption can also be realized without interfering the high speed operation of the NTL circuit.

(4) Following effects can be obtained from the items (1) to (3). The load driving capability of NTL circuit and falling rate of output signal can be set adequately by providing adequate capacitance between the pull-down transistor and the transistor receiving the input signal. The load driving capability of NTL circuit and falling rate of output signal can be changed by configurating the bias circuit with the transistor to be controlled with the predetermined base voltage and changing the predetermined base voltage in accordance with the control voltage supplied from the external terminal and variation of speed of a plurality of NTL circuits can be suppressed and the testability efficiency of the large capacity gate array integrated circuit formed by the NTL circuit can be improved. The falling rate of output signal can always be improved effectively irrespective of external environment of the load means of the NTL circuit by forming the bias circuit with the resistance which feeds back the output signal. The circuit configuration described above can also be used in the gate circuit or latch circuit by ECL circuit in addition to the NTL circuit, resulting in wide range operation principle of the present invention.

(5) From the items (1) to (4), high integration density can be realized because the lower power consumption can be realized without impeding high speed operation of the high speed logic integrated circuit including the NTL circuit.

While the present invention has been explained based on the embodiment thereof, the present invention is naturally not limited and allows various changes or modifications without departure from the scope of the invention.

For example, in each embodiment, the high level $V_H$ and low level $V_L$ of the digital input signals $V_{i1}$–$V_{i6}$ and digital output signals $v_{o1}$–$V_{o9}$ can be set to the desired levels. In addition, the power source voltage $V_{cc}$ of circuit may be replaced with a positive source source voltage by setting the power source voltage $V_{ee}$ of circuit to the ground potential and the polarity thereof can also be inverted by replacing the bipolar transistor with the PNP transistor. The phase split circuit 1, phase inversion circuit 14, D latch circuit 21, current switching circuit 22 and complementary signal circuit 23 shown in the embodiments of FIG. 5, FIG. 8, FIG. 10–FIG. 14, FIG. 16–FIG. 19 and FIG. 22 –FIG. 26 may be formed using the NOS (metal-oxide-semiconductor) transistor, and a speed-up capacitance may be provided to the resistance $R_3$ to be provided between the emitter of bipolar transistor $Q_1$ forming the phase split circuit 1 and the power source voltage $V_{ee}$ in the embodiment shown in FIG. 5, FIG. 8, FIG. 10–FIG. 14, FIG. 16–FIG. 19 and FIG. 22. Moreover, the embodiments shown in FIG. 10, FIG. 14 and FIG. 22 are capable of providing a desired number of fan-in by replacing the bipolar transistor $Q_1$ forming the phase split circuit 1 with a plurality of transistors connected in parallel. In FIG. 18, the base of pull-down transistor $Q_{23}$ forming the active pull-down circuit may be coupled directly to the nodes connected in common of the resistances $R_{10}$ and $R_{11}$ without passing through the resistance $R_{12}$. In FIG. 19, the diode $D_1$ provided between the bipolar transistor $Q_4$ forming the bias circuit 3 and the power source voltage $V_{cc}$ of the circuit may be replaced with a plurality of diodes or transistors in accordance with the level of constant voltage $V_{b3}$ and the capacitance $C_{a2}$ may be removed. In addition, combination of a practical circuit configuration and power source voltage in each embodiment can employ various forms.

In the above explanation, the inventions by the inventors of the present invention are applied to the NTL circuit and ECL circuit of the gate array which is the application field as the background of the present invention, but the application field is not limited thereto and the present invention can also be applied, for example, to the semiconductor integrated circuit device such as MPU (microprocessor) of which application field is fixed. The present invention can be applied at least to the logic circuit including the output emitter follower circuit or various kinds of semiconductor integrated circuit device including such logic circuit.

Another aspect of the present invention will now be discussed. As noted previously, a conventional logic circuit such as the ECL circuit having an emitter follower output transistor can have a good rising characteristic of the signal by virtue of the low output impedance of the emitter follower output transistor. However, since the falling characteristic of the signal is dependent on the time constant determined by the capacitance of the load and the resistance of the emitter follower, an LSI for a gate array designed to achieve high-speed operation and high packaging density inevitably consumes a great amount of power. Therefore, an active pull-down circuit is proposed, for example, in the gazette of Japanese Laid-Open Patent Publication No. 50-134356, which circuit improves the falling characteristic of the output signal of an emitter follower output circuit while it keeps low the power consumption in the steady state.

There is also an NTL circuit which, different from such as the above described ECL circuit discriminating between high level and low level by reference to the threshold voltage, has no special logic threshold. In the NTL circuit, the signal is amplified by being passed through a plurality of gate circuits. When input/output transfer characteristics of a plurality of gate circuits cross virtually at the center voltage, an input level higher than the cross point is progressively amplified and finally converges to the high level side. In a logic gate circuit, a plurality of logic gates are arranged in multiple stages, and therefore, even if there is fluctuation of the transfer characteristic in the NTL circuit, level correction is achieved by passing a signal through other logic gates having similar fluctuation and, therefore, fluctuation of the transfer characteristic practically poses no problem. Such NTL circuit is described, for example, in Genji Baba, "Modern Dictionary of Electronic Devices", published by Radio Technology Company on Mar. 20, 1976, p. 72. As patents relating to NTL circuits, there are those disclosed in Japanese patent Publication Nos. 42-21132, 42-2294, and 45-32005 published respectively in 1967, 1967 and 1970.

Figure 39:
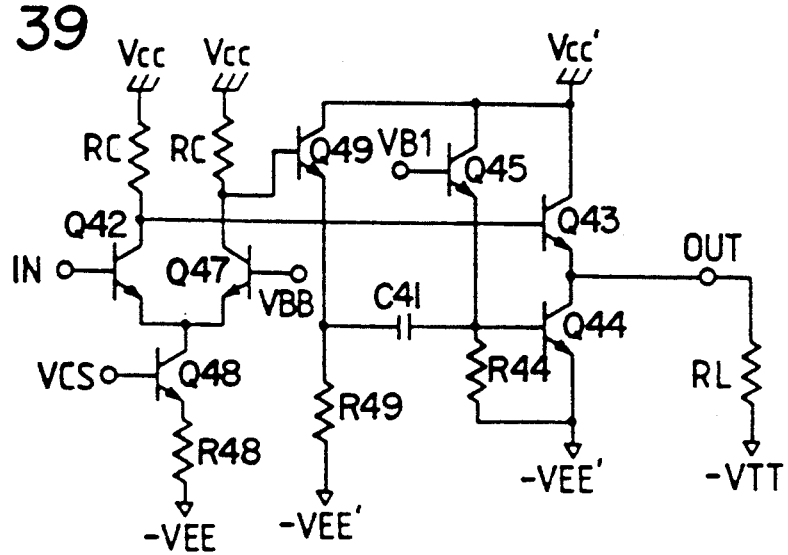
FIG. 39 is a circuit diagram showing an example of an active pull-down circuit investigated by the present inventor in the process of accomplishing the present invention.

In FIG. 39 is shown a circuit diagram of an example of an ECL circuit provided with an active pull-down circuit which the present inventors investigated. A transistor Q44 provided for an emitter-follower output transistor Q33, in the steady state, is biased to its base-emitter voltage $V_{BE}$ by a bias circuit made up of a resistor R48 and a transistor Q45 so that virtually no current is passed therethrough. At the time when the signal is changed and thereby the transistor Q43 is switched from on state to off state, the transistor Q44 is turned on by a signal with reverse phase transmitted from an emitter-follower transistor Q49 through a capacitor C41, and thereby, the output terminal OUT is quickly discharged.

However, if the signal level should change while the discharging through the capacitor C41 is going on, a sufficient falling characteristic of the output signal would not be obtained. In order to obtain a sufficient falling characteristic of the output signal, it is necessary to take such measures as to increase the capacitance of the capacitor C41 or increase the steady-state current flowing through the transistor Q44. If such measures are taken, however, there arise problems of fluctuation of the falling characteristic of the output signal, deterioration in the rising characteristic due to undershooting made by the output signal, and increase in the power consumption, which the present inventors found out through their investigation.

Accordingly, another object of the present invention is to provide a logic circuit which, while keeping power consumption low, achieves high-speed signal outputting.

This and other objects and novel features of the present invention will become apparent from the description given hereinbelow and the accompanying drawings.

A representative aspect of this aspect of the present invention is as follows. An emitter follower output transistor receiving an output signal generated by the logic portion is connected in series with an active pull-down transistor supplied, at the base, with a signal, which has reverse phase to that of the input signal supplied to the base of the output transistor, through a capacitance element. Between the base and emitter thereof, there is provided a bias circuit formed of a transistor supplied with a predetermined bias voltage and an emitter resistor, and there is further provided a capacitance element for feeding back the output signal to the emitter of the transistor forming the bias circuit.

According to the above-described arrangement, the base potential of the active pull-down transistor, at the time of the fall of the output signal, is lowered by the turning on of the bias transistor caused by the signal given thereto through the feedback capacitance element, and thereby, excessive action of the active pull-down transistor is suppressed and, hence, occurrence of undershooting of the output can be prevented.

Figure 34:
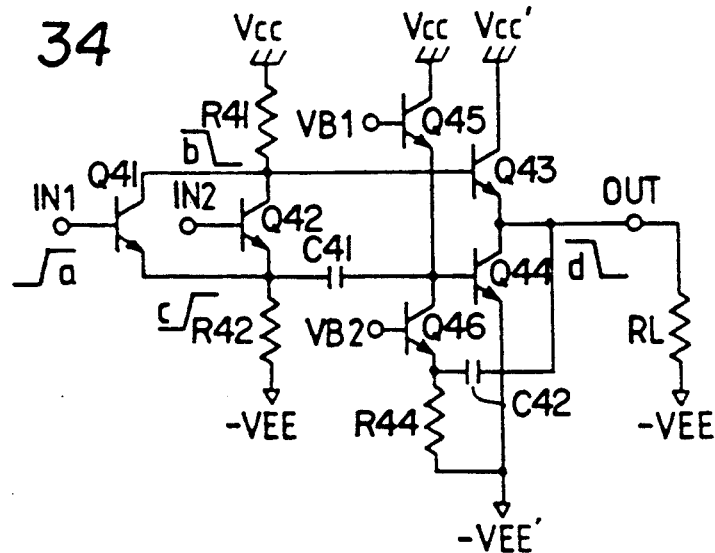
FIG. 34 is a circuit diagram showing an embodiment in which an active pull-down circuit according to the present invention is applied to an NTL circuit.

FIG. 34 shows a circuit diagram of an embodiment in which an active pull-down circuit according to the present invention is applied to an NTL circuit. Circuit elements in the diagram are formed on one semiconductor substrate of single crystalline silicon or the like by known fabrication technology of bipolar integrated circuit.

The circuit formed of transistors Q41 and Q42 receiving signals from input terminals IN1 and IN2, a resistor R41 provided for the collectors connected with each other of the transistors Q41 and Q42 and a resistor R42 for the emitters connected with each other of the same constitutes an NTL circuit. More specifically, when the signal at the input terminal IN1 or IN2 is high, the transistor Q41 or Q42 is turned on, whereby an output signal determined by the ratio of resistance between the resistors R41 and R42 at a level as low as approximately −0.5 V is produced, and when the signals at the input terminals IN1 and IN2 are both low, both the transistors Q41 and Q42 are turned off, whereby a signal b at a level as high as 0 V is generated at the collector. Hence the NTL circuit constitutes a two-input NOR gate logic circuit.

The collector output signal b of the transistors Q41 and Q42 is supplied to the base of an emitter-follower output transistor Q43. The transistor Q43 has its emitter connected in series with an active pull-down transistor Q44. The base of the transistor Q44 is supplied with an output signal c with reverse phase obtained from the emitter of the transistors Q41 and Q42 through a capacitor C41. In order to pass a relatively small idling current through the transistor Q44 in the steady state, a bias circuit as described below is provided.

Between the base and emitter of the transistor Q44, there are inserted a transistor Q46 receiving a Predetermined bias voltage VB2 and its emitter resistor R44. Further, to the base of the transistor Q44 is connected the emitter of a transistor Q45 receiving a predetermined bias voltage VB1. The collector of the transistor Q45 is connected with the ground potential point.

Further, in order to prevent occurrence of an undershoot of the output signal, there is provided in the present embodiment a capacitor C42 allowing the output signal to be fed back to the emitter of the bias transistor Q42.

For example, when the signals at the input terminals IN1 and IN2 are both at low level and hence both the transistors Q41 and Q42 are in the off state, their collector output becomes as high as 0 V, the ground potential. This high level is subjected to a level shift through the base and emitter of the emitter-follower output transistor Q43, and as a result, the potential at the output terminal OUT is brought to a level as high as approximately −0.8 V.

From this state, if the signal a at the input terminal IN1 changes from low level to high level, the output signal b changes from high level to low level. As a result, the output transistor Q43 is virtually put into an off state and the output signal c with reverse Phase obtained from the emitter of the transistor Q41 is changed from low level to high level, and this change to high level causes, through the capacitor C41, the base potential of the transistor Q44 to be temporarily held high. Thereby, the transistor Q44 is turned on and the output signal d of the output terminal OUT is quickly changed from high level to low level. Then, this change causes, through the capacitor C42, the emitter potential of the transistor Q46 to go to low level in a manner as if it were an A.C. wave. Thereby, a collector current flows through the transistor Q46, and this causes the base potential of the transistor Q44 to lower. In other words, the high potential transmitted from the capacitor C41 to the base of the transistor Q44 in accordance with the change of the signal g to high level is repressed by the low level signal fed back through the capacitor C42. Thus, an undershoot of the output signal d is prevented from occurring.

Since the occurrence of the undershoot of the output signal d can be prevented as described above, it becomes possible to set the capacitance of the capacitor C41 to a considerably high value for improvement of the falling characteristic to the low level of the signal d and yet to prevent occurrence of the undershoot of the signal d by the feedback control with the capacitor C42. This means in substance that the rising characteristic of the base potential of the transistor Q44 can be prevented from deteriorating.

For the capacitor C41, a relatively large capacitance value can be set up without substantially increasing the layout area by utilizing the base take-out electrode of the transistor Q42. Also for the feedback capacitor C42, the take-out electrode of the emitter of the transistor Q46 and others can be utilized so as to achieve reduction in the layout area.

The operating voltage supply for the output circuit through which a relative)y large current flows can be arranged separate from that for the input logic portion through which a relatively small current flows. That is, the separation is made such that the power source lines for the input logic portion are comprised of Vcc and −VEE, while those for the output portion are comprised of Vcc′ and −VEE′. By virtue of such arrangement, the level margin of the signal can be prevented from being degraded by noises which are produced in the power line Vcc′ or −VEE′ during the operation of the output circuit and transmitted to the input logic portion.

Figure 35:
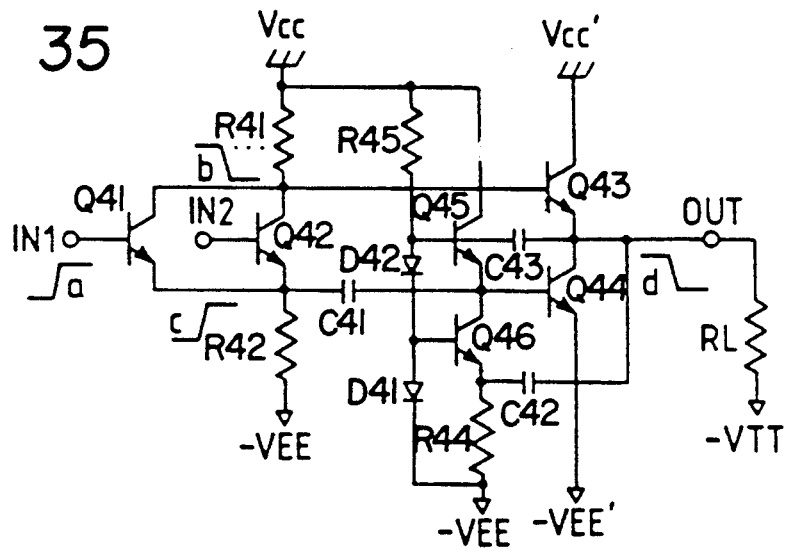
FIG. 35 is a circuit diagram showing another embodiment in which an active pull-down circuit according to the present invention is applied to an NTL circuit.

FIG. 35 shows a circuit diagram of another embodiment in which an active pull-down circuit according to the present invention is applied to an NTL circuit.

In this embodiment, the output signal d is fed back to the base of the transistor Q45 through a capacitor C43. Though not limitative, the bias voltages supplied to the base of the transistors Q46 and Q45 are provided by a series circuit of diodes D41 and D42 and a resistor R45. More specifically, the base of the transistor Q46 is supplied with a forward voltage $V_F$ across the diode D41. The base of the transistor Q45 is supplied with a forward voltage 2 $V_F$ across the diodes D41 and D42. The resistor R45 forms a constant bias current to be passed through the diodes D41 and D42. That is, a constant current $-(VEE-2\ V_F)/R45$ is passed through the resistor R45 and this constant current is passed through the transistors Q45 and Q46.

In the described arrangement, the circuit producing the bias voltages VB1 and VB2 can be formed of such simple circuit elements as the resistor R45 and the diodes D41 and D42.

The feedback capacitor C43 improves the rising characteristic of the output signal d. More specifically, when the output signal d goes from low level to high level, this change in level acts through the capacitor C43 On the transistor Q45 to raise its base potential. Thereby, the action of the capacitor C41 when the level of the signal g with reverse phase changes from high level to low level exerted on the transistor Q4 to lower its base potential is repressed. Generally, when the base potential of the transistor Q44 goes lower than that in the steady state, the transistor Q44 is turned on after the steady state has been restored. Hence, the response characteristic when the signal c is quickly changed from low level to high level is deteriorated. In the present embodiment, by virtue of the feedback signal transmitted through the capacitor C43, the base potential of the transistor Q44, when the output signal d goes high, is prevented from going lower than the bias point by the action exerted thereon through the capacitor C41.

Thus, in the present embodiment, the response characteristics to the switched input are greatly improved by means of the feedback capacitors C42 and C43.

Figure 36:
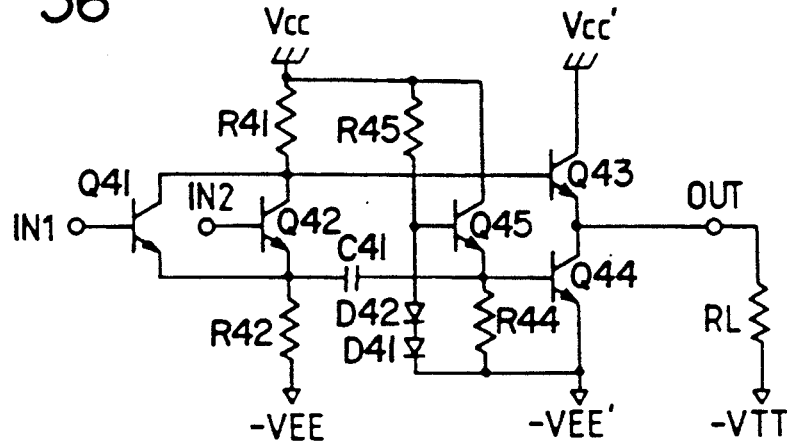
FIG. 36 is a circuit diagram showing a further embodiment in which an active pull-down circuit according to the present invention is applied to an NTL circuit.

FIG. 36 shows a circuit diagram of a further embodiment in which an active pull-down circuit according to the present invention is applied to an NTL circuit.

When an active pull-down circuit is used, it is required to provide a circuit to generate a bias voltage VB1 allowing an idling current to flow through the pull-down transistor Q44 as described above. The bias circuit in the present embodiment is structured of diodes D41 and D42 and a resistor R45 in series connection, the same as that used in the above described embodiment More specifically, a forward voltage 2 $V_F$ produced by the diodes D41 and D42 is supplied to the base of the transistor Q45. Thus, the transistor Q45 and the diodes D41 and D42 are arranged in a current mirror configuration and it is made possible to allow a constant current provided by the resistor R45 to flow through the transistors Q45 and Q44. With such arrangement, the bias circuit when the active pull-down circuit is used can be simply structured.

Figure 37:
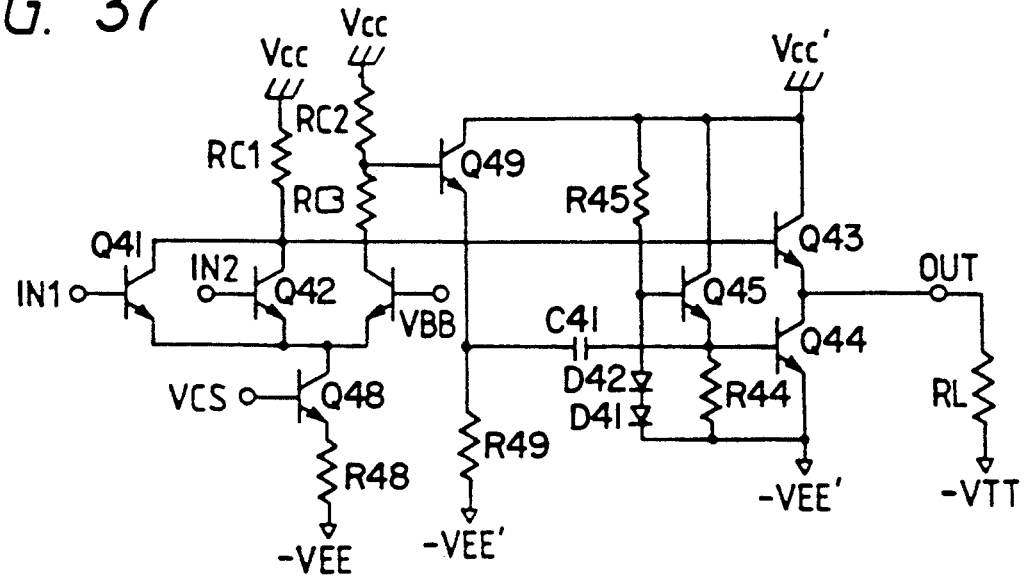
FIG. 37 is a circuit diagram showing an embodiment in which an active pull-down circuit according to the present invention is applied to an ECL circuit.

FIG. 37 shows an embodiment in which an active pull-down circuit according to the present invention is applied to an ECL circuit.

In the ECL circuit, an output signal and a signal with reverse phase are obtained from a differential transistor circuit. Accordingly, the signal with reverse phase to be transmitted to the base of the active pull-down transistor Q44 is obtained from the emitter of an emitter follower output transistor Q49 receiving the collector output of an inverting output transistor Q47 supplied with a reference voltage VBB.

In the present case, the load resistor in the differential transistor circuit is divided into two, RC2 and RC3, whereby the level of the signal transmitted to the base of the active pull-down transistor Q44 through the capacitor C41 is set up, and the response characteristic of the base of the active pull-down Q44 can be optimally set up. Thus, the undershoot produced by an excessively high level of the signal transmitted to the base of the transistor Q44 through the capacitor C41 and excessive reverse biasing of the transistor Q44 at the timing of the rise of the output signal can be prevented from occurring.

The bias circuit of the present invention is structured of the diodes D41 and D42 and the resistor R45 connected in series the same as the bias circuit used in the above described embodiment. More specifically, a forward voltage 2 $V_F$ produced by the diodes D41 and D42 is supplied to the base of the transistor Q45. Thus, the transistor Q45 and the diodes D41 and D42 are arranged in a current mirror configuration and it is made possible to allow a constant current provided by the resistor R45 to flow through the transistors Q41 and Q42. With such arrangement, the bias circuit when the active pull-down circuit is used can be simply provided. Instead of the above described arrangement, the bias circuit may be such that supplies a predetermined bias voltage VB1 to the base of the transistor Q45.

Figure 38:
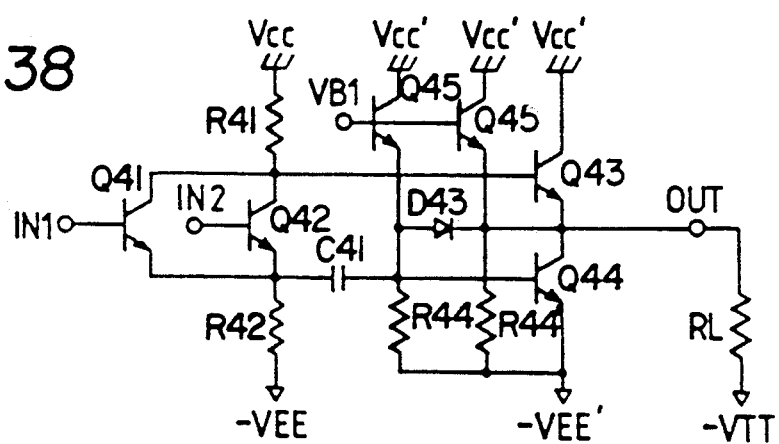
FIG. 38 is a circuit diagram showing another embodiment in which an active pull-down circuit according to the present invention is applied to an NTL circuit.

FIG. 38 shows a circuit diagram of another embodiment of an active pull-down circuit according to the resent invention applied to an NTL circuit.

In this embodiment, a diode D43 is used as a variable capacitance element for having the output signal fed back to the base of the active pull-down transistor Q44. In this arrangement, when the input signal IN1 goes high, the diode D43 is reversely biased and its capacitance value is decreased. Thereby, the portion escaping through the diode D43 out of the Pulse current to be supplied to the base of the transistor Q44 through the capacitor C41 can be reduced. In contrast with this, when the input signal IN1 goes low, the lowering of the potential at the base of the transistor Q44 by the action exerted thereon through the capacitor C41 can be compensated for by the rise of the output signal at the output terminal OUT fed back thereto through the diode D43. At this time, the reverse bias voltage is lowered and, proportionally to it, the capacitance is increased, and hence a great fed back quantity can be obtained. In short, the diode D43 has the same function as that of the capacitor C43 in FIG. 2. In the case of the circuit of FIG. 35, the capacitor C43 and the capacitor C41 are separated by the transistor Q45 and no problem is posed. In the case of the present embodiment, since the capacitor C41 and the feedback capacitance element are in series connection, the signal to be transmitted to the base of the transistor Q44 through the capacitor C41 may escape to the output terminal side through the feedback capacitance element, but this escaping can be prevented by the use of the diode D43 as a variable capacitance element.

The transistor Q45 receiving the bias voltage VB1 is for allowing a bias current to flow through the transistor Q44 and the transistor Q45" and the resistor R44', provided for its emitter are for producing a bias voltage provided to the diode D43 as a reverse bias voltage so that it may act as the capacitance element.

Functional effects obtained from the above described embodiments are as follows:

(1) An emitter follower output transistor receiving an output signal generated by the logic portion is connected in series with an active pull-down transistor supplied, at the base, with a signal, which has reverse phase to that of the input signal supplied to the base of the output transistor, through a capacitance element. Between the base and emitter thereof, there is provided a bias circuit formed of a transistor supplied with a predetermined bias voltage and an emitter resistor, and there is further provided a capacitance element for feeding back the output signal to the emitter of the transistor forming the bias circuit. According to the above described arrangement, the base potential of the active pull-down transistor, at the time of the fall of the output signal, is lowered by the turning on of the bias transistor caused by the signal given thereto through the feedback capacitance element, and thereby, excessive action of the active pull-down transistor is suppressed and, hence, occurrence of undershooting of the output can be prevented while the falling characteristic of the output signal is improved.

(2) An emitter follower output transistor receiving an output signal generated by the logic portion is connected in series with an active pull-down transistor supplied, at the base, with a signal, which has reverse phase to that of the input signal supplied to the base of the output transistor, through a capacitance element. As a bias circuit provided for the base of the active pull-down transistor, a bias current supplying transistor whose emitter is connected with the base of the active pull-down transistor, two forward diodes disposed between the base of the bias current supplying transistor and the emitter of the active pull-down transistor, and a resistance element allowing a bias current to flow through the forward diodes. Thus, an effect is obtained that configuration of the circuit can be simplified.

(3) When the logic circuit is constituted of an ECL circuit, the load resistor for forming the reverse output signal in the differential transistor circuit is divided in two, whereby the signal level supplied to the base of the active pull-down transistor is made adjustable. Thus, an effect is obtained that setting for optimal operation of the active pull-down transistor can be achieved with a simple circuit configuration.

While the invention made by the present inventor has been described concretely as related to some embodiments, it is apparent that the present invention is not limited to the above described embodiments but various modifications may be made without departing from the spirit of the present invention. For example, in the circuits of embodiments in FIG. 34 and FIG. 35, the input logic portion may be replaced by an ECL circuit. The load resistor RL provided for the output terminal OUT in the circuit for each embodiment is just for generally representing a load and it does not mean that such a resistance element is connected. The power supply lines and operating voltages of the logic portion and the output portion may be separated according to the need. The number of the input terminals may be increased or decreased according to the need.

The present invention can be widely applied to logic circuits comprised of a high-speed logic portion such as NTL and ECL and an active pull-down circuit.

We claim:

1. A semiconductor integrated circuit device comprising:
   first and second input terminals;
   first and second voltage supply terminals;
   an output terminal;
   a first input NPN bipolar transistor having a base coupled to the first input terminal, a collector and an emitter;
   a second input NPN bipolar transistor having a base coupled to the second input terminal, a collector coupled to the collector of the first input NPN bipolar transistor and an emitter coupled to the emitter of the first input NPN bipolar transistor;

a first load element coupled between the first voltage supply terminal and the collector of the first input NPN bipolar transistor;

a second load element coupled between the emitter of the first input NPN bipolar transistor and the second voltage supply terminal;

a first output NPN bipolar transistor having a base coupled to the collector of the first input NPN bipolar transistor, and having a collector-emitter path coupled between the first voltage supply terminal and the output terminal;

a second output NPN bipolar transistor having a collector-emitter path coupled between the output terminal and the second voltage supply terminal, and having a base; and a capacitor element having a first electrode coupled to the emitter to the first input NPN bipolar transistor and a second electrode coupled to the base of the second output NPN bipolar transistor, wherein said semiconductor integrated circuit further comprises bias means for supplying a bias signal to the base of said second output NPN bipolar transistor, and wherein said bias means comprises a bias bipolar transistor having an emitter coupled to the base of said second output NPN bipolar transistor, a base for receiving a predetermined signal and a collector coupled to said first voltage supply terminal, and a resistor coupled between the base of said second output NPN bipolar transistor and the second voltage supply terminal.

2. A semiconductor integrated circuit device according to claim 1, wherein the bias bipolar transistor is of NPN type.

3. A semiconductor integrated circuit device according to claim 2, wherein collectors of the first output NPN bipolar transistor and the bias bipolar transistor are formed in common on a semiconductor chip.

4. A semiconductor integrated circuit device according to claim 1, wherein the capacitor element includes a dielectric film between the first and second electrodes.

5. A semiconductor integrated circuit device comprising:

first and second voltage supply terminals; and at least first and second logic circuits, each including:

first and second input terminals;

an output terminal;

a first input NPN bipolar transistor having a base coupled to the first input terminal, a collector and an emitter;

a second input NPN bipolar transistor having a base coupled to the second input terminal, a collector coupled to the collector of the first input NPN bipolar transistor, and an emitter coupled to the emitter of the first input NPN bipolar transistor;

a first load element coupled between the first voltage supply terminal and the collector of the first input NPN bipolar transistor;

a second load element coupled between the emitter of the first input NPN bipolar transistor and the second voltage supply terminal;

a first output NPN bipolar transistor having a base coupled to the collector of the first input NPN bipolar transistor, and a collector-emitter path coupled between the first voltage supply terminal and the output terminal;

a second output NPN bipolar transistor having a collector-emitter path coupled between the output terminal and the second voltage supply terminal, and having a base; and a capacitor element having a first electrode coupled to the emitter of the first input NPN bipolar transistor and a second electrode coupled to the base of the second output NPN bipolar transistor, wherein at least one of said first and second logic circuits further comprises bias means for supplying a bias signal to the base of said second output NPN bipolar transistor, and wherein said bias means comprises a bias bipolar transistor having an emitter coupled to the base of said second output NPN bipolar transistor, a base for receiving a predetermined signal and a collector coupled to said first voltage supply terminal, and a resistor coupled between the base of said second output NPN bipolar transistor and the second voltage supply terminal.

6. A semiconductor integrated circuit device according to claim 5, wherein the output terminal of the first logic circuit is coupled to the output terminal of the second logic circuit.

7. A semiconductor integrated circuit device according to claim 5, wherein the output terminal of the first logic circuit and the output terminal of the second logic circuit is coupled to the first input terminal of the first logic circuit.

8. A semiconductor integrated circuit device according to the claim 5, wherein the output of the first logic circuit is coupled to the first input terminal of the second logic circuit.

9. A semiconductor integrated circuit device according to claim 5, wherein:

the bias bipolar transistor is of NPN type.

10. A semiconductor integrated circuit device according to claim 9, wherein, in each of the first and second logic circuits, the collectors of the first output NPN bipolar transistor and bias bipolar transistor are formed in common on a semiconductor chip.

11. A semiconductor integrated circuit device according to claim 10, wherein the first and second load elements in the first and second logic circuits are resistor elements.

12. A semiconductor integrated circuit device according to claim 10, wherein the capacitor element of each of the first and second logic circuits includes a dielectric film between the first and second electrodes.

13. A semiconductor integrated circuit device comprising:

first, second and third voltage supply terminals;

a first logic circuit including:

first and second input terminals;

an output terminal;

a first input NPN bipolar transistor having a base coupled to the second input terminal, a collector coupled to the first input terminal, and an emitter;

a second input NPN bipolar transistor having a base coupled to the second input terminal, a collector coupled to the collector of the first input NPN bipolar transistor, and an emitter coupled to the emitter of the first input NPN bipolar transistor;

a first load element coupled between the first voltage supply terminal and the collector of the first input NPN bipolar transistor;

a second load element coupled between the emitter of the first input NPN bipolar transistor and the second voltage supply terminal;

a first output NPN bipolar transistor having a base coupled to the collector of the first input NPN bipolar transistor, and having a collector-emitter path coupled between the first voltage supply terminal and the output terminal;

a second output NPN bipolar transistor having a collector-emitter path coupled between the output terminal and the second voltage supply terminal, and having a base; and a capacitor element having a first electrode coupled to the emitter of the first input NPN bipolar transistor and a second electrode coupled to the base of the second output NPN bipolar transistor, wherein said first logic circuit further comprises bias means for supplying a bias signal of a third voltage level to the base of said second output NPN bipolar transistor, and wherein said bias means comprises a bias bipolar transistor having an emitter coupled to the base of said second output NPN bipolar transistor, a base for receiving a predetermined signal and a collector coupled to said first voltage supply terminal, and a resistor coupled between the base of said second output NPN bipolar transistor and the second voltage supply terminal;

a second logic circuit including:

first and second differentially connected bipolar transistors each having a base, an emitter and a collector, the base of the first differentially connected bipolar transistor being coupled to the output terminal of the first logic circuit, the base of the second differentially connected bipolar transistor being coupled to receive a reference voltage, and the emitters of the first and second differentially connected bipolar transistors being coupled to each other to form a common emitter;

load resistors coupled between the first voltage supply terminal and the respective collectors of the first and second differentially connected bipolar transistors, and a current source coupled between the common emitter and the third voltage supply terminal.

14. A semiconductor integrated circuit device according to claim 13, wherein the bias bipolar transistor is of NPN type.

15. A semiconductor integrated circuit device according to claim 13, wherein the collectors of the first output NPN bipolar transistor and bias bipolar transistor are formed in common on a semiconductor chip.

16. A semiconductor integrated circuit device according to claim 13, wherein the first and second load elements are resistor elements.

17. A semiconductor integrated circuit device according to claim 13, wherein the capacitor element includes a dielectric film between the first and second electrodes.

* * * * *